US012805130B2

(12) United States Patent
Lee et al.

(10) Patent No.: US 12,805,130 B2
(45) Date of Patent: Nov. 17, 2026

(54) TOUCH DISPLAY DEVICE AND DISPLAY PANEL

(71) Applicant: LG Display Co., Ltd., Seoul (KR)

(72) Inventors: Yangsik Lee, Seoul (KR); HwiDeuk Lee, Gumi-si (KR); YoungJoon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 436 days.

(21) Appl. No.: 18/239,638

(22) Filed: Aug. 29, 2023

(65) Prior Publication Data

US 2024/0090283 A1 Mar. 14, 2024

(30) Foreign Application Priority Data

Sep. 13, 2022 (KR) ........................ 10-2022-0114718

(51) Int. Cl.
*H10K 59/131* (2023.01)
*G06F 3/041* (2006.01)
(Continued)

(52) U.S. Cl.
CPC ......... *H10K 59/131* (2023.02); *G06F 3/0412* (2013.01); *G06F 3/04184* (2019.05);
(Continued)

(58) Field of Classification Search
CPC .................. H10K 59/131; H10K 59/40; G06F 3/044–0448; G06F 3/041–0412;
(Continued)

(56) References Cited

U.S. PATENT DOCUMENTS

2017/0102825 A1* 4/2017 Kim .................... G06F 3/04166
2021/0064170 A1 3/2021 Hwang et al.
(Continued)

FOREIGN PATENT DOCUMENTS

KR 10-2017-0043983 A 4/2017
KR 10-2021-0026603 A 3/2021
(Continued)

OTHER PUBLICATIONS

Ministry of Intellectual Property of Korea, Office Action, Korean Patent Application No. 10-2022-0114718, Dec. 12, 2025, 21 pages.

*Primary Examiner* — Hang Lin
(74) *Attorney, Agent, or Firm* — Fenwick & West LLP

(57) ABSTRACT

A touch display device and a display panel are disclosed. Specifically, there may be provided a touch display device comprising a display area in which a plurality of subpixels are arranged in a first direction and a second direction, a reference voltage line extending along the first direction in a first line area between the plurality of subpixels, a data line extending along the first direction in a second line area between the plurality of subpixels, a driving voltage line extending along the first direction in a third line area between the plurality of subpixels, a touch electrode pattern disposed to overlap the reference voltage line or the driving voltage line, and a touch driving circuit applying a touch driving signal to the touch electrode pattern through a touch line and detecting touch according to a change in capacitance.

17 Claims, 14 Drawing Sheets

(51) Int. Cl.
*G06F 3/044* (2006.01)
*H10K 59/40* (2023.01)
*G09G 3/3233* (2016.01)

(52) U.S. Cl.
CPC ............. *G06F 3/044* (2013.01); *H10K 59/40* (2023.02); *G06F 2203/04112* (2013.01); *G09G 3/3233* (2013.01); *G09G 2300/0426* (2013.01); *G09G 2300/0819* (2013.01); *G09G 2300/0842* (2013.01)

(58) Field of Classification Search
CPC .. G06F 2203/04112; G09G 2300/0819; G09G 2300/0842
See application file for complete search history.

(56) References Cited

U.S. PATENT DOCUMENTS

| | | | | |
|---|---|---|---|---|
| 2021/0132723 A1* | 5/2021 | Kim | G06F 3/04164 |
| 2021/0159250 A1* | 5/2021 | Chang | H10H 29/012 |
| 2021/0159299 A1* | 5/2021 | Wang | H10K 59/131 |
| 2021/0249451 A1* | 8/2021 | Kim | H10D 86/441 |
| 2021/0272513 A1* | 9/2021 | Chen | G09G 3/2092 |
| 2022/0148519 A1 | 5/2022 | Hwang et al. | |
| 2023/0119909 A1* | 4/2023 | Yang | G09G 3/2092<br>345/55 |

FOREIGN PATENT DOCUMENTS

| | | |
|---|---|---|
| KR | 10-2021-0085116 A | 7/2021 |
| KR | 10-2021-0085202 A | 7/2021 |
| KR | 10-2022-0064625 A | 5/2022 |
| KR | 10-2022-0090070 A | 6/2022 |

* cited by examiner

TOUCH DISPLAY DEVICE AND DISPLAY PANEL

CROSS-REFERENCE TO RELATED APPLICATION

This application claims priority from Republic of Korea Patent Application No. 10-2022-0114718, filed on Sep. 13, 2022, which is hereby incorporated by reference in its entirety.

BACKGROUND

Field

Embodiments of the disclosure relate to a touch display device and a display panel.

Description of Related Art

With the development of multimedia, the importance of flat panel display devices is increasing. In response, flat panel display devices, such as liquid crystal displays, plasma display panels, and organic light emitting displays, have been commercialized.

Also in wide use are touch display devices having a touch panel stacked on a display device, which may detect the point touched by the user's hand or a stylus pen when an electrical characteristic, such as resistance or capacitance, is changed at the touch point, output information corresponding to the touch point, or perform calculation.

Such a touch display device is a user interface and has increasing application to small portable terminals, office devices, mobile devices, and the like, for example.

However, as the touch display device has a separate touch panel stacked, it has many drawbacks, such as an increased thickness, reduced light transmittance, and increased manufacturing costs. To address such issues, advanced in-cell touch (AIT) type display devices are proposed which have built-in touch electrodes inside the pixel areas of the display panel.

In such a touch display device, unnecessary parasitic capacitance may be formed in addition to capacitance required for touch sensing during touch driving and sensing processes.

In capacitance-based touch sensing, unnecessary parasitic capacitance may increase the load of touch driving and decrease the accuracy of touch sensing and, in worse scenario cases, cause touch sensing impossible.

The issues with unnecessary parasitic capacitance may be severe in touch screen panel (TSP) embedded display panels.

Further, TSP-embedded display panels may undergo a reduction in the aperture ratio of the emission area due to the conductive structures disposed on or connected to the touch-screen panel and the display panel.

SUMMARY

Accordingly, the inventors of the disclosure have invented a touch display device and a display panel capable of effectively reducing parasitic capacitance.

Embodiments of the disclosure may provide a touch display device and a display panel capable of increasing the aperture ratio by effectively arranging touch electrodes and touch lines.

Embodiments of the disclosure may provide a touch display device and a display panel capable of increasing the aperture ratio by disposing the touch electrode to overlap the reference voltage line and disposing the touch line to overlap the driving voltage line or between data lines.

Embodiments of the disclosure may provide a touch display device and a display panel capable of reducing parasitic capacitance by connecting the driving voltage line or the reference voltage line through an active layer.

Embodiments of the disclosure may provide a touch display device and a display panel capable of effectively reducing parasitic capacitance by synchronizing the reference voltage applied through the reference voltage line with the touch driving signal applied to the touch electrode.

Embodiments of the disclosure may provide a touch display device comprising a display area in which a plurality of subpixels are arranged in a first direction and a second direction, a reference voltage line extending along the first direction in a first line area between the plurality of subpixels, a data line extending along the first direction in a second line area between the plurality of subpixels, a driving voltage line extending along the first direction in a third line area between the plurality of subpixels, a touch electrode pattern disposed to overlap the reference voltage line or the driving voltage line, and a touch driving circuit applying a touch driving signal to the touch electrode pattern through a touch line and detecting touch according to a change in capacitance.

Embodiments of the disclosure may provide a display panel comprising a display area in which a plurality of subpixels are arranged in a first direction and a second direction, a reference voltage line extending along the first direction in a first line area between the plurality of subpixels, a data line extending along the first direction in a second line area between the plurality of subpixels, a driving voltage line extending along the first direction in a third line area between the plurality of subpixels, and a touch electrode pattern disposed to overlap the reference voltage line or the driving voltage line.

According to embodiments of the disclosure, there may be provided a touch display device and a display panel capable of effectively reducing parasitic capacitance.

According to embodiments of the disclosure, there may be provided a touch display device and a display panel capable of increasing the aperture ratio by effectively arranging touch electrodes and touch lines.

According to embodiments of the disclosure, there may be provided a touch display device and a display panel capable of increasing the aperture ratio by disposing the touch electrode to overlap the reference voltage line and disposing the touch line to overlap the driving voltage line or between data lines.

According to embodiments of the disclosure, there may be provided a touch display device and a display panel capable of reducing parasitic capacitance by connecting the driving voltage line or the reference voltage line through an active layer.

According to embodiments of the disclosure, there may be provided a touch display device and a display panel capable of effectively reducing parasitic capacitance by synchronizing the reference voltage applied through the reference voltage line with the touch driving signal applied to the touch electrode.

BRIEF DESCRIPTION OF DRAWINGS

The above and other objects, features, and advantages of the disclosure will be more clearly understood from the following detailed description, taken in conjunction with the accompanying drawings, in which.

DETAILED DESCRIPTION

Figure 1:
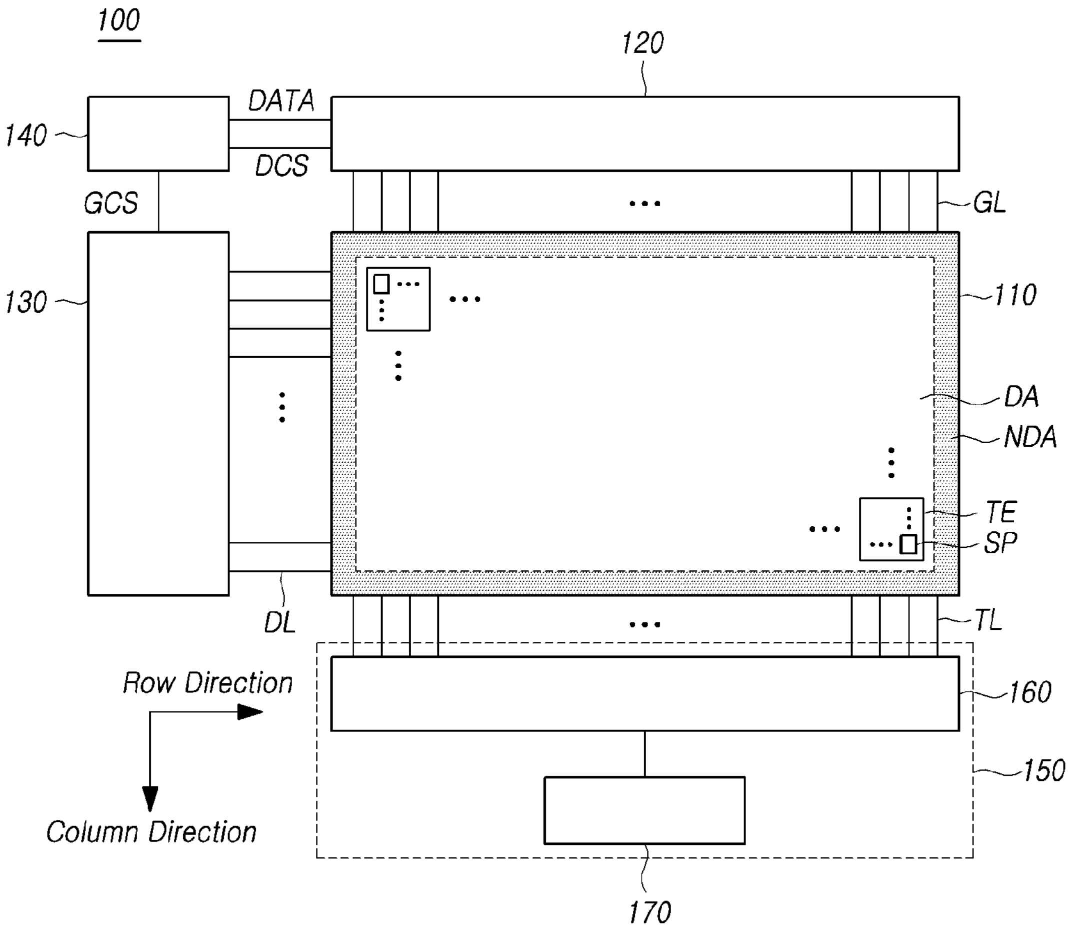
FIG. 1 is a view schematically illustrating a touch display device according to embodiments of the disclosure.

Hereinafter, some embodiments of the disclosure will be described in detail with reference to exemplary drawings. In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", and "constituting" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors e.g., process factors, internal or external impact, noise, etc.) even when a relevant description is not specified. Further, the term "may" fully encompasses all the meanings of the term "can".

Hereinafter, various embodiments of the disclosure will be described in detail with reference to the accompanying drawings.

FIG. 1 is a view schematically illustrating a configuration of a touch display device according to an embodiment.

Referring to FIG. 1, a touch display device 100 according to embodiments of the disclosure may include a display panel 110, a data driving circuit 120, a gate driving circuit 130, and a timing controller 140 as components for displaying images.

The display panel 110 may include a display area DA in which images are displayed and a non-display area NDA in which no image is displayed.

The non-display area NDA may be an outer area of the display area DA and be referred to as a bezel area. The non-display area NDA may be an area visible from the front of the touch display device 100 or an area that is bent and not visible from the front of the touch display device 100.

The display panel 110 may include a plurality of subpixels SP. For example, the touch display device 100 may be various types of display devices including a liquid crystal display device, an organic light emitting display device, a micro light emitting diode (micro LED) display device, and a quantum dot display device.

The structure of each of the plurality of subpixels SP may vary according to the type of the touch display device 100. For example, when the touch display device 100 is a self-emission display device in which the subpixels SP emit light by themselves, each subpixel SP may include a light emitting element that emits light by itself, one or more transistors, and one or more capacitors.

The display panel 110 may further include various types of signal lines to drive the plurality of subpixels SP. For example, various types of signal lines may include a plurality of data lines DL transferring data signals (also referred to as data voltages or image data) and a plurality of gate lines GL transferring gate signals (also referred to as scan signals).

The plurality of data lines DL and the plurality of gate lines GL may cross each other. Each of the plurality of data lines DL may be disposed while extending in a column direction. Each of the plurality of gate lines GL may be disposed while extending in a row direction.

Here, the column direction and the row direction are relative. For example, the column direction may be a vertical direction and the row direction may be a horizontal direction. As another example, the column direction may be a horizontal direction and the row direction may be a vertical direction.

The data driving circuit 120 is a circuit for driving the plurality of data lines DL, and may output data signals to the plurality of data lines DL. The gate driving circuit 130 is a circuit for driving the plurality of gate lines GL, and may supply gate signals to the plurality of gate lines GL.

The timing controller 140 is a device for controlling the data driving circuit 120 and the gate driving circuit 130 and may control driving timings for the plurality of data lines DL and driving timings for the plurality of gate lines GL.

The timing controller 140 may supply various types of data driving control signals DCS to the data driving circuit 120 to control the data driving circuit 120 and may supply various types of gate driving control signals GCS to the gate driving circuit 130 to control the gate driving circuit 130.

The data driving circuit 120 may supply data voltages to the plurality of data lines DL according to the driving timing control by the timing controller 140. The data driving circuit 120 may receive digital image data DATA from the timing controller 140 and may convert the received image data DATA into analog data voltages and output them to the plurality of data lines DL.

The gate driving circuit 130 may supply gate signals to the plurality of gate lines GL according to the timing control of the timing controller 140. The gate driving circuit 130 may receive a first gate voltage corresponding to a turn-on level voltage and a second gate voltage corresponding to a turn-off level voltage, along with various gate driving control signals GCS, generate gate signals, and supply the generated gate signals to the plurality of gate lines GL. The turn-on level voltage may be a high-level voltage, and the turn-off level voltage may be a low-level voltage. Conversely, the turn-on level voltage may be a low-level voltage, and the turn-off level voltage may be a high-level voltage.

To provide a touch sensing function as well as an image display function, the touch display device 100 may include a touch panel and a touch driving circuit 150 that senses the touch panel to detect whether a touch occurs by a touch object, such as a finger or pen, or the position of the touch.

The touch driving circuit 150 may include a touch sensing circuit 160 that drives and senses the touch panel and generates and outputs touch sensing data and a touch controller 170 that may detect an occurrence of a touch or the position of the touch using touch sensing data.

The touch panel may include a plurality of touch electrodes TE as touch sensors. The touch panel may further include a plurality of touch lines TL for electrically connecting the plurality of touch electrodes TE and the touch sensing circuit 160. The touch panel or touch electrode TE is also referred to as a touch sensor.

The touch panel may exist outside or inside the display panel 110. When the touch panel exists outside the display panel 110, the touch panel is referred to as an external-type touch panel. When the touch panel is of the external type, the touch panel and the display panel 110 may be separately manufactured or may be combined. The external-type touch panel may include a substrate and a plurality of touch electrodes TE on the substrate.

When the touch panel exists inside the display panel 110, the touch panel is referred to as an internal-type touch panel. In the internal-type touch panel, the touch panel may be formed in the display panel 110 during a manufacturing process of the display panel 110.

The touch sensing circuit 160 may supply a touch driving signal to at least one of the plurality of touch electrodes TE and detect a touch sensing signal transferred from at least one touch electrode TE among the plurality of touch electrodes TE, generating touch sensing data.

The touch driving circuit 150 may perform touch sensing in a self-capacitance sensing scheme or a mutual-capacitance sensing scheme. The touch driving circuit 150 may apply a touch driving signal to the touch electrode pattern through the touch line TL and detect a touch according to a change in capacitance.

When the touch driving circuit 150 performs touch sensing in the self-capacitance sensing scheme, the touch driving circuit 150 may perform touch sensing based on capacitance between each touch electrode TE and the touch object (e.g., finger or pen).

When the touch driving circuit 150 performs touch sensing in the mutual-capacitance sensing scheme, the touch driving circuit 150 may perform touch sensing based on capacitance between the touch electrodes TE.

According to the mutual-capacitance sensing scheme, the plurality of touch electrodes TE are divided into driving touch electrodes and sensing touch electrodes. The touch sensing circuit 160 may drive the driving touch electrode by the touch driving signal and may detect the touch sensing signal from the sensing touch electrode.

According to the self-capacitance sensing scheme, each of the touch electrodes TE may serve both as a driving touch electrode and as a sensing touch electrode. The touch sensing circuit 160 may drive all or some of the plurality of touch electrodes TE and sense all or some of the plurality of touch electrodes TE.

The size of the touch electrode TE may correspond to the size of one subpixel SP and may correspond to the size of two or more subpixels SP. A touch electrode pattern composed of a plurality of touch electrodes TE may be designed in various shapes.

The touch electrode pattern may be a plate type without an opening or a mesh type with openings. When the touch electrode pattern is a plate type without an opening, the touch electrode TE may be a transparent electrode. When the touch electrode pattern is a mesh type having openings, all or some of the openings may correspond to the emission area of the subpixel SP or correspond to the subpixels SP.

The touch sensing circuit 160 and the touch controller 170 may be implemented as separate devices or as a single device.

Alternatively, the touch sensing circuit 160 and the data driving circuit 120 may be implemented as separate integrated circuits. Alternatively, the whole or part of the touch sensing circuit 160 and the whole or part of the data driving circuit 120 may be integrated into a single integrated circuit.

The touch display device 100 according to embodiments of the disclosure may be a self-emissive display device having self-emissive light emitting elements disposed on the display panel 110, such as an organic light emitting display device, a quantum dot display device, a micro LED display device, and the like.

Figure 2:
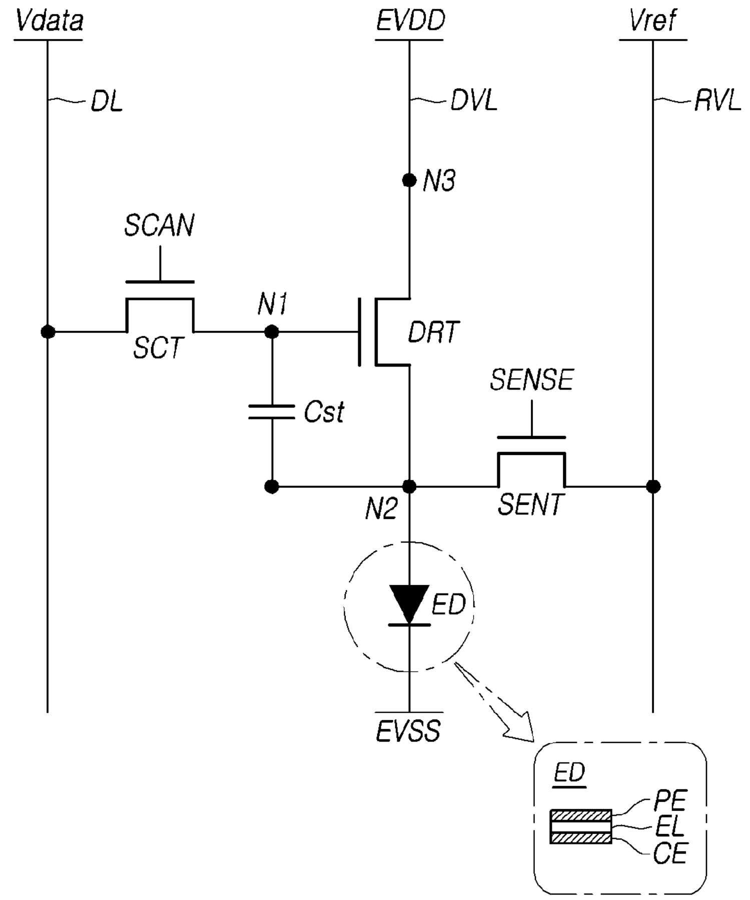
FIG. 2 is a view illustrating an example of a subpixel circuit of a touch display device according to embodiments of the disclosure.

FIG. 2 is a view illustrating an example of a subpixel circuit of a touch display device according to embodiments of the disclosure.

Referring to FIG. 2, a subpixel SP of the touch display device 100 according to embodiments of the disclosure may include a light emitting element ED, a driving transistor DRT for controlling the current flowing to the light emitting element ED to drive the light emitting element ED, a scan transistor SCT for transferring a data voltage Vdata to a first node N1 which is the gate node of the driving transistor DRT, and a storage capacitor Cst for maintaining the voltage during a predetermined period.

In the touch display device 100 according to embodiments of the disclosure, each subpixel SP may further include a sense transistor SENT for an initialization operation and a sensing operation.

Since the subpixel SP exemplified herein has three transistors DRT, SCT, and SENT and one capacitor Cst to drive the light emitting element ED, the subpixel SP is referred to as having a 3T (transistor) 1C (capacitor) structure.

The light emitting element ED may include a pixel electrode PE and a common electrode CE, and a light emitting layer EL positioned between the pixel electrode PE and the common electrode CE. In the light emitting element ED, the pixel electrode PE may be an anode electrode, and the common electrode CE may be a cathode electrode. Or, the pixel electrode PE may be a cathode electrode, and the common electrode CE may be an anode electrode. The light emitting element ED may be, e.g., an organic light emitting diode, an inorganic light emitting diode, or a quantum dot light emitting element.

A base voltage EVSS may be applied to the common electrode CE of the light emitting element ED. The base voltage EVSS may be a ground voltage or a voltage similar to the ground voltage, for example.

The driving transistor DRT is a transistor for driving the light emitting element ED, and includes a first node N1, a second node N2, and a third node N3.

The first node N1 of the driving transistor DRT is a node corresponding to the gate node and may be electrically connected with the source node or drain node of the scan transistor SCT. The second node N2 of the driving transistor DRT may be electrically connected with the pixel electrode PE of the light emitting element ED and may be the source node or drain node. The third node N3 of the driving transistor DRT may be a node to which driving voltage EVDD is applied, be electrically connected with a driving voltage line DVL for supplying the driving voltage EVDD, and be the drain node or source node. Hereinafter, for convenience of description, in the example described below, the second node N2 of the driving transistor DRT may be a source node and the third node N3 may be a drain node.

In response to the scan signal SCAN supplied from a corresponding scan signal line among a plurality of scan signal lines which are a kind of the gate lines GL, the scan transistor SCT may control connection between the first node N1 of the driving transistor DRT and a corresponding data line DL among the plurality of data lines DL.

The drain node or source node of the scan transistor SCT may be electrically connected to a corresponding data line DL. The source node or drain node of the scan transistor SCT may be electrically connected to the first node N1 of the driving transistor DRT. The gate node of the scan transistor SCT may be electrically connected to the scan signal line, which is a kind of gate line GL, to receive the scan signal SCAN.

The scan transistor SCT may be turned on by the scan signal SCAN of a turn-on level voltage and transfer the data voltage Vdata supplied from the data line DL to the first node N1 of the driving transistor DRT.

The scan transistor SCT is turned on by the turn-on level scan signal SCAN and turned off by the turn-off level scan signal SCAN. When the scan transistor SCT is of the n type, the turn-on level may be a high-level voltage, and the turn-off level may be a low-level voltage. When the scan transistor SCT is of the p type, the turn-on level may be a low-level voltage, and the turn-off level may be a high-level voltage.

In response to the sense signal SENSE supplied from a corresponding sense signal line among a plurality of sense signal lines which are a kind of the gate lines GL, the sense transistor SENT may control connection between the second node N2 of the driving transistor DRT and a corresponding reference voltage line RVL among the plurality of reference voltage lines RVL.

The drain node or source node of the sense transistor SENT may be electrically connected to the reference voltage line RVL. The source node or drain node of the sense transistor SENT may be electrically connected to the second node N2 of the driving transistor DRT and may be electrically connected to the pixel electrode PE of the light emitting element ED. The gate node of the sense transistor SENT may be electrically connected to the sense signal line, which is a kind of gate line GL, to receive the sense signal SENSE.

The sense transistor SENT may be turned on by the turn-on level sense signal SENSE and transfer a reference voltage Vref supplied from the reference voltage line RVL to the second node N2 of the driving transistor DRT.

The sense transistor SENT is turned on by the turn-on level sense signal SENSE and turned off by the turn-off level sense signal SENSE. When the sense transistor SENT is of the n type, the turn-on level may be a high-level voltage, and the turn-off level may be a low-level voltage. When the sense transistor SENT is of the p type, the turn-on level may be a low-level voltage, and the turn-off level may be a high-level voltage.

The storage capacitor Cst may be electrically connected between the first node N1 and the second node N2 of the driving transistor DRT to maintain the data voltage Vdata corresponding to the image data during one frame time.

The storage capacitor Cst may be an external capacitor intentionally designed to be outside the driving transistor DRT, but not a parasite capacitor (e.g., Cgs or Cgd) which is an internal capacitor present between the first node N1 and the second node N2 of the driving transistor DRT.

Each of the driving transistor DRT, the scan transistor SCT, and the sense transistor SENT may be an n-type transistor or a p-type transistor. All of the driving transistor DRT, the scan transistor SCT, and the sense transistor SENT may be n-type transistors or p-type transistors. At least one of the driving transistor DRT, the scan transistor SCT, and the sense transistor SENT may be an n-type transistor (or a p-type transistor), and the others may be p-type transistors (or n-type transistors).

The 3T1C structure of the subpixel SP exemplified herein is merely an example for description, and may further include one or more transistors or, in some cases, one or more storage capacitors. The plurality of subpixels SP may have the same structure, or some of the plurality of subpixels SP may have a different structure.

The touch display device 100 according to embodiments of the disclosure may have a top emission structure or a bottom emission structure. However, for convenience of description, an example in which the touch display device 100 according to embodiments of the disclosure has a bottom emission structure is described below.

Figure 3:
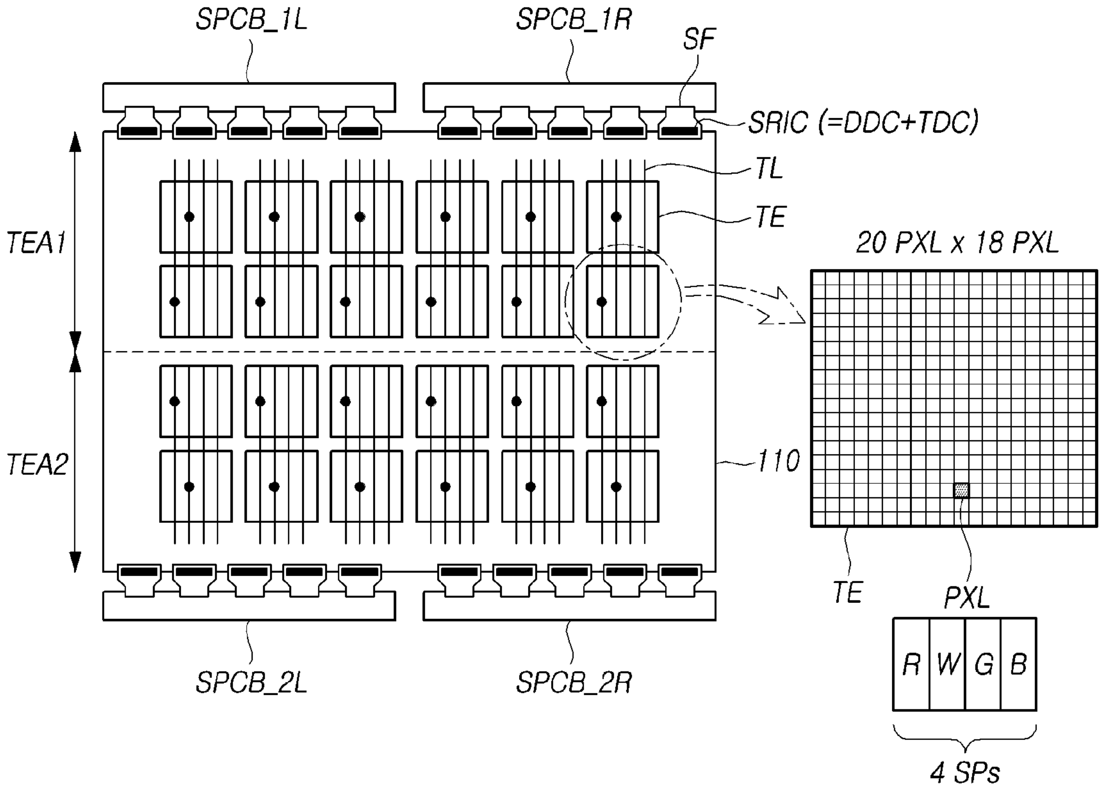
FIG. 3 is a view illustrating an example of a touch sensing system when a touch display device includes a large-scale display panel according to embodiments of the disclosure.

FIG. 3 is a view illustrating an example of a touch sensing system when a touch display device includes a large-scale display panel according to embodiments of the disclosure.

Referring to FIG. 3, in the touch display device 100 according to embodiments of the disclosure, the data driving circuit 120 may be divided into a plurality of data drivers DDC. The plurality of data drivers DDC may have different data lines DL for driving.

The touch driving circuit 150 may be divided into a plurality of touch drivers TDC. The plurality of touch drivers TDC may have different touch electrodes TE for driving and sensing.

The touch display device 100 according to embodiments of the disclosure may include a plurality of source-readout integrated circuits SRIC. Each of the plurality of source-readout integrated circuits SRIC may include a data driver DDC and a touch driver TDC.

When the display panel 110 is a large-scale one, the display panel 110 may be divided into a first driving area TEA1 and a second driving area TEA2.

The first driving area TEA1 of the display panel 110 may be connected to one or more first source printed circuit boards SPCB_1L and SPCB_1R through a plurality of circuit films SF. A first source-readout integrated circuit SRIC may be mounted on each of the plurality of circuit films SF.

The second driving area TEA2 of the display panel 110 may be connected to one or more second source printed circuit boards SPCB_2L and SPCB_2R through a plurality of circuit films SF. One source-readout integrated circuit SRIC may be mounted on each of the plurality of circuit films SF.

The touch electrodes TE disposed in the first driving area TEA1 of the display panel 110 may be driven and sensed by a plurality of first source-readout integrated circuits SRIC corresponding to the first driving area TEA1.

The touch electrodes TE disposed in the second driving area TEA2 of the display panel 110 may be driven and sensed by a plurality of second source-readout integrated circuits SRIC corresponding to the second driving area TEA2.

For example, one touch electrode TE disposed on the large display panel 110 may overlap the area occupied by pixels (20 PXL*18 PXL) disposed in 20 rows and 18 columns Here, one pixel PXL may include four subpixels SP.

The four subpixels SP include a red subpixel R emitting red light, a white subpixel W emitting white light, a green subpixel G emitting green light, and a blue subpixel B emitting blue light.

Figure 4:
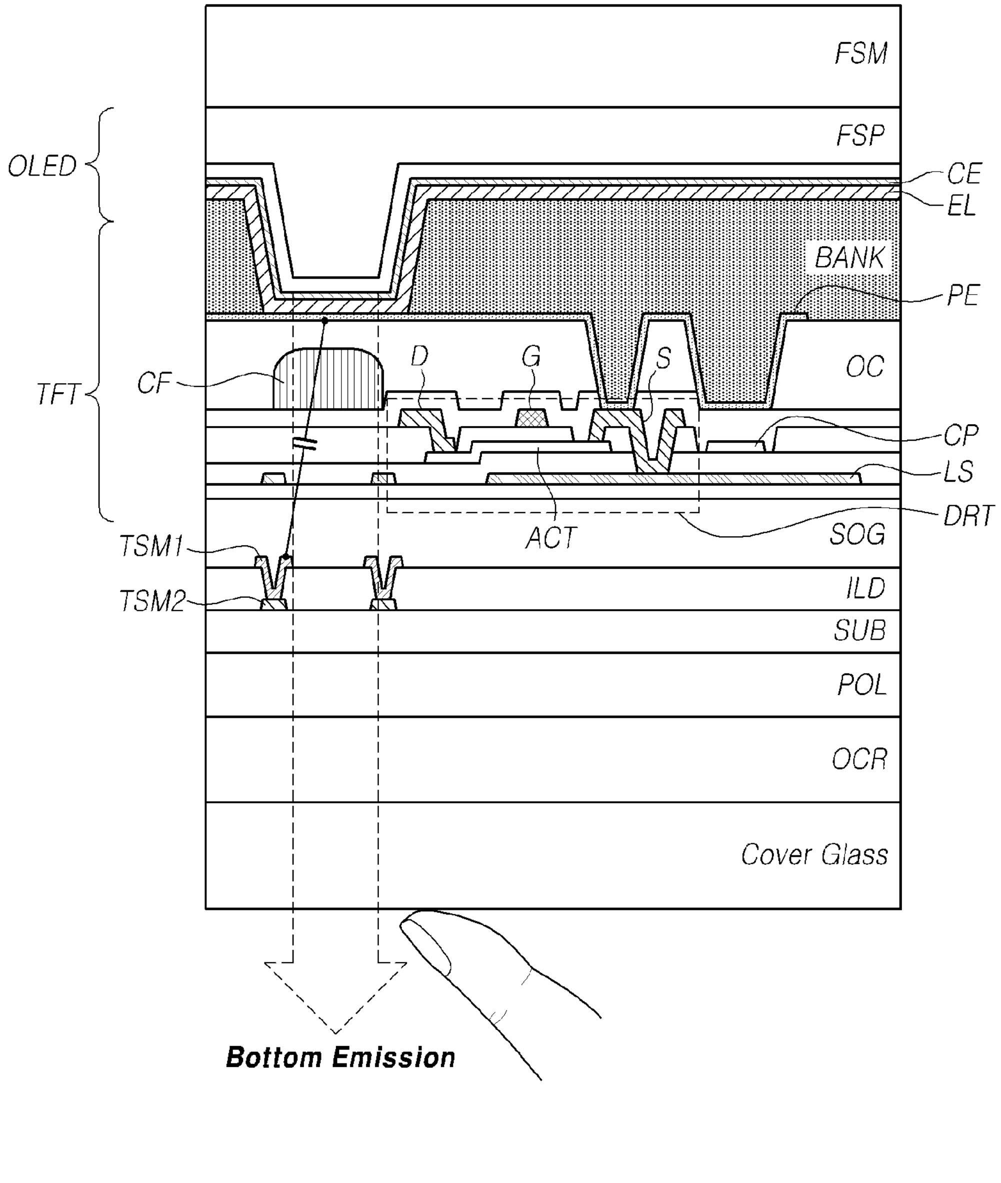
FIG. 4 is a cross-sectional view illustrating a display panel according to embodiments of the disclosure.

FIG. 4 is a cross-sectional view illustrating a display panel according to one embodiment.

Referring to FIG. 4, a display panel 110 may include a cover glass, a transparent adhesive layer OCR on the cover glass, a polarizing plate POL disposed on the transparent adhesive layer OCR, and a substrate SUB disposed on the polarizing plate POL.

Two touch sensor metals TSM1 and TSM2 may be disposed on the substrate SUB to form the touch electrode TE and the touch line TL. An inter-layer insulation film ILD may be positioned between the two touch sensor metals TSM1 and TSM2. The touch electrode TE may be formed using one or more of the two touch sensor metals TSM1 and TSM2. The touch line TL may be formed using one or more of the two touch sensor metals TSM1 and TSM2.

One or more insulation layers SOG may be positioned on the two touch sensor metals TSM1 and TSM2 and the inter-layer insulation film ILD. The insulation layer SOG positioned on the two touch sensor metals TSM1 and TSM2 may be formed through a spin-on-glass method. Here, the spin-on-glass method may be a process of forming an insulation film by rotationally applying glass dissolved with an organic solvent to the surface on which the insulation layer SOG is to be formed and heat-treating the surface.

The transistor TFT may be formed on the insulation layer SOG formed by the spin-on-glass method.

The transistor TFT may include several insulation layers, an active layer ACT, a gate node G, a source node S, and a drain node D. The gate node G, the source node S, and the drain node D may be formed using the same gate metal.

The transistor TFT may be a driving transistor DRT having a source node S connected to the pixel electrode PE.

A light shield LS overlapping the active layer ACT may be disposed under the active layer ACT of the driving transistor DRT. An area in which the light shield LS is disposed may correspond to a non-emission area between the emission areas of the subpixel SP. To stabilize the channel of the driving transistor DRT, the light shield LS may be electrically connected to the source node S of the driving transistor DRT.

A portion of the light shield LS may overlap the capacitor pattern CP that may be formed of the same material as the active layer ACT. The capacitor pattern CP may serve to increase the capacitance of the storage capacitor Cst by making the capacitance of the storage capacitor Cst in the subpixel SP double.

A color filter CF may be disposed on the insulation layer on the transistor TFT. An organic light emitting diode OLED may be formed as the light emitting element ED on the transistor TFT. The organic light emitting diode OLED may include a pixel electrode PE, a light emitting layer EL, and a common electrode CE.

An overcoat layer OC may be positioned on the transistor TFT and the color filter CF, a pixel electrode PE may be positioned on the overcoat layer OC, and the pixel electrode PE may be connected to the source node S of the transistor TFT through a contact hole of the overcoat layer OC.

A bank BANK may be positioned on the pixel electrode PE. The bank BANK may be a black bank capable of blocking light. The light emitting layer EL may be disposed on an upper area of the bank BANK and an area in which the bank BANK is opened. In the area in which the bank BANK is opened, the light emitting layer EL is positioned on the pixel electrode PE.

A common electrode CE is disposed on the light emitting layer EL. A metal encapsulation layer FSM and an adhesive layer FSP that adheres the metal encapsulation layer FSM to the component thereunder and may also have an encapsulation function may be disposed on the common electrode CE.

When the display panel 110 has a bottom emission structure, two touch sensor metals TSM1 and TSM2 capable of constituting a touch sensor including a plurality of touch electrodes TE and a plurality of touch lines TL may be disposed between the transistor TFT and the substrate SUB.

When the display panel 110 has a bottom emission structure, the color filter CF may be disposed between the plurality of touch electrodes TE and the pixel electrode PE.

In the bottom emission structure, the touch electrode TE composed of one or more of the two touch sensor metals TSM1 and TSM2 may form a parasitic capacitance with the pixel electrode PE that may be the anode electrode. By driving the display, the pixel electrode PE may have an inevitable voltage variation, which is undesired noise component for the touch electrode TE. Therefore, touch sensitivity of finger or pen touching may be reduced.

In particular, when the touch display device 100 is formed to have a large display panel 110, the capacitance deviation may increase depending on the positions of the touch electrode TE and the touch line TL extending from the touch driving circuit 150, accelerating deterioration of touch sensitivity.

Figure 5:
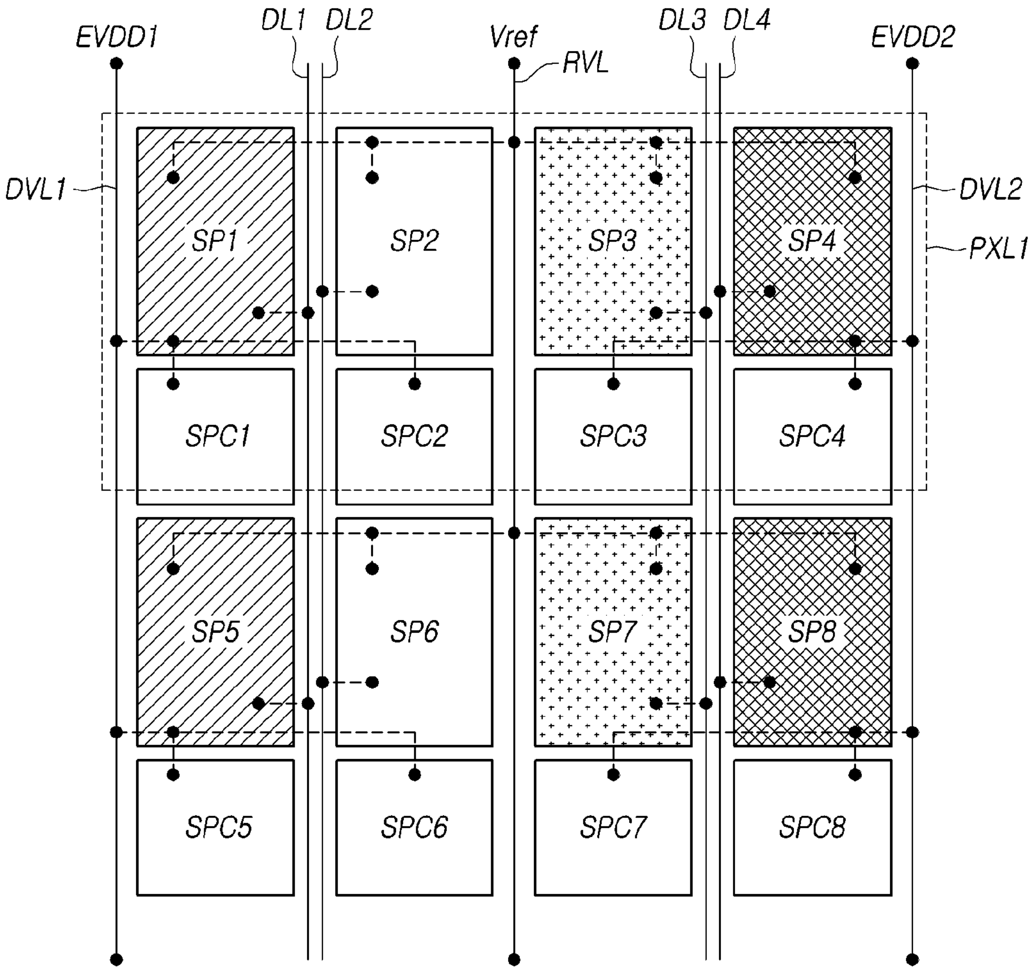
FIG. 5 is a view illustrating an example arrangement structure of signal lines for four subpixels in a display panel according to embodiments of the disclosure.

FIG. 5 is a view illustrating an example arrangement structure of signal lines for four subpixels in a display panel.

Referring to FIG. 5, a reference voltage line RVL may be a signal line extending in a column direction for transmitting a display reference voltage during a display driving period and transmitting a sensing reference voltage for sensing a characteristic value of a driving transistor DRT in a blank period.

In this case, one reference voltage line RVL may be disposed every four subpixel (SP) columns for driving efficiency purposes.

In this case, the four subpixels SP1, SP2, SP3, and SP4 will be four subpixels belonging to any one subpixel (SP) row for four subpixel (SP) columns. Here, the four subpixels SP1, SP2, SP3, and SP4 may constitute one pixel PXL1, and may be, e.g., a subpixel emitting red light, a subpixel emitting white light, a subpixel emitting green light, and a subpixel emitting blue light, respectively.

The four subpixels SP1, SP2, SP3, and SP4 may be connected to subpixel circuits SPC1, SPC2, SPC3, and SPC4 capable of controlling light emission of the corresponding subpixels SP1, SP2, SP3, and SP4. The four subpixels SP5, SP6, SP7, and SP8 may be connected to subpixel circuits SPC5, SPC6, SPC7, and SPC8 capable of controlling light emission of the corresponding subpixels SP5, SP6, SP7, and SP8.

The four subpixels SP1, SP2, SP3, and SP4 are electrically connected to correspond to the four data lines DL1, DL2, DL3, and DL4, respectively. Further, the four subpixels SP1, SP2, SP3, and SP4 may be commonly connected to one reference voltage line RVL. In other words, one reference voltage line RVL may be shared by four subpixels SP1, SP2, SP3, and SP4.

In this case, the driving transistor DRT corresponding to the four subpixels SP1, SP2, SP3, and SP4 may commonly receive the reference voltage Vref through one reference voltage line RVL.

Further, one or more driving voltage lines DVL for transferring the driving voltage EVDD may be disposed to transfer the driving voltage EVDD to one or more subpixels SP. Here, an example in which two subpixels SP are connected to one driving voltage line DVL is described.

As described above, the colors of the subpixels SP constituting the pixel are not limited to white, red, green, and blue, and the color or position may vary depending on the type of the display device 100.

As described above, the driving voltage line DVL or the reference voltage line RVL may be disposed in the non-emission area between the subpixels SP in the pixel PXL constituting the display panel 110. In this case, the driving voltage line DVL or the reference voltage line RVL may be connected to the gate metal of the transistor TFT. However, when the gate metal of the transistor TFT is used to connect the driving voltage line DVL or the reference voltage line RVL positioned below, the depth of formation of the contact hole may increase, making the manufacturing process difficult and causing loss.

Further, the aperture ratio may be decreased by the light shield LS disposed to block light between the subpixels SP, and the touch sensitivity may be reduced by the capacitance formed between the reference voltage line RVL and the light shield LS and the capacitance formed between the light shield LS and the touch electrode TE.

In particular, when the size of the touch display device 100 increases or the resolution of the touch display device 100 increases, the interval between the subpixels SP decreases, and thus a decrease in light emission efficiency or aperture ratio may deteriorate not only touch sensitivity but also image quality.

The touch display device 100 according to the disclosure may increase the aperture ratio by disposing the touch electrode TE to overlap the reference voltage line RVL. In this case, the touch line TL may overlap the driving voltage line DVL or may be disposed between the data lines DL to further increase the aperture ratio.

Further, the touch display device 100 according to the disclosure may additionally dispose the touch electrode TE to overlap the driving voltage line DVL. In this case, the parasitic capacitance may be reduced by connecting the driving voltage line DVL or the reference voltage line RVL through the active layer ACT.

Further, the touch display device 100 according to the disclosure may effectively reduce parasitic capacitance by synchronizing the reference voltage Vref applied through the reference voltage line RVL with the touch driving signal applied to the touch electrode TE.

Figure 6:
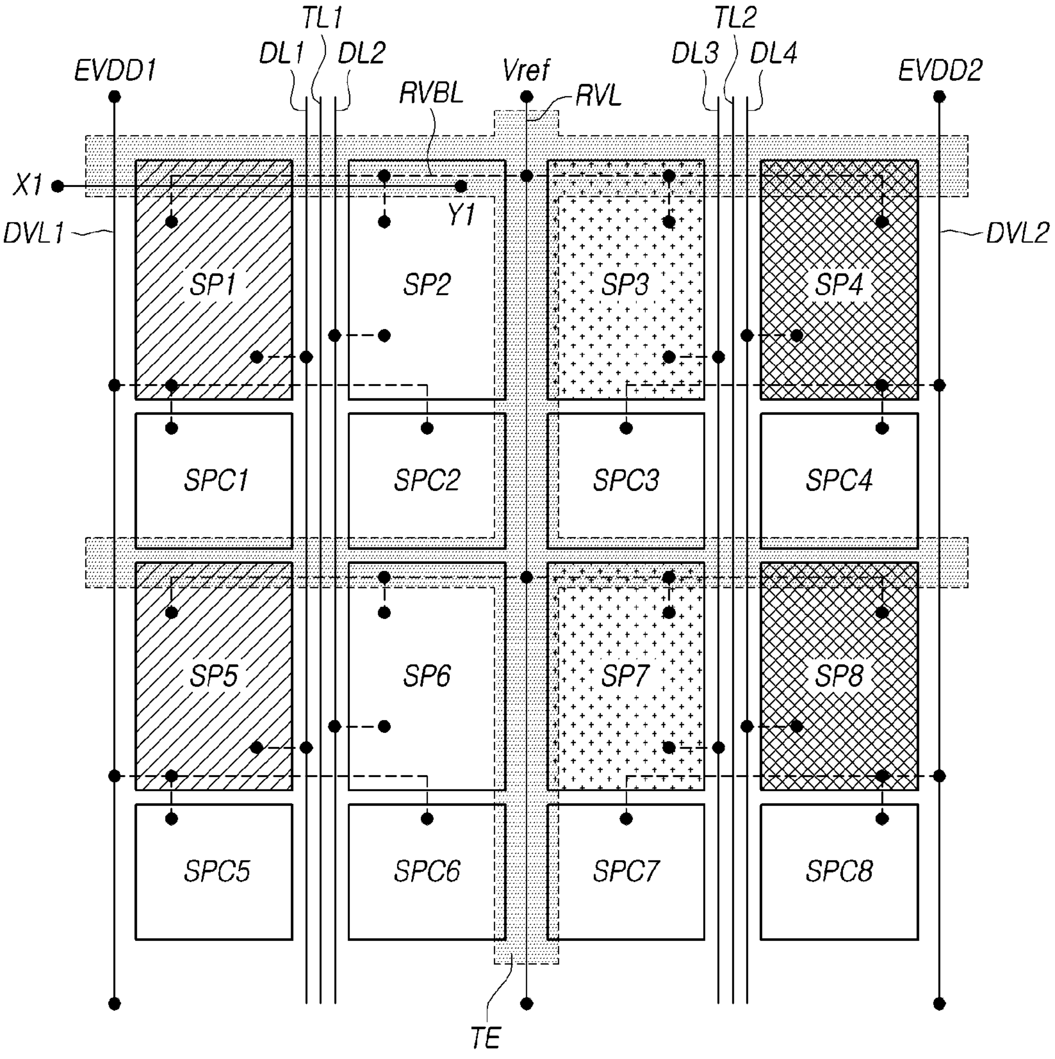
FIG. 6 is a plan view illustrating an example display panel in which a touch electrode is disposed to overlap a reference voltage line in a touch display device according to embodiments of the disclosure.

FIG. 6 is a plan view illustrating an example display panel in which a touch electrode is disposed to overlap a reference voltage line in a touch display device according to embodiments of the disclosure.

Referring to FIG. 6, in the display panel 110 of the touch display device 100 according to embodiments of the disclosure, the reference voltage line RVL for transferring the display reference voltage or the sensing reference voltage may be disposed in an area between subpixels SP, and the touch electrode TE may be disposed to overlap the reference voltage line RVL.

The four subpixels SP1, SP2, SP3, and SP4 constituting one pixel PXL1 may be four subpixels belonging to one subpixel (SP) row. For example, the four subpixels SP1, SP2, SP3, and SP4 may be a subpixel that emits red light, a subpixel that emits white light, a subpixel that emits green light, and a subpixel that emits blue light, respectively.

In this case, one reference voltage line RVL may be disposed every four sub-pixel (SP) columns for driving efficiency purposes, and an area in which the reference voltage line RVL extends in the vertical direction may be referred to as a first line area.

The reference voltage line RVL extending in the vertical direction may be commonly connected to the four subpixels SP1, SP2, SP3, and SP4 through the reference voltage bridge line RVBL branched in the horizontal direction. The reference voltage bridge line RVBL may extend through an upper area of four subpixels SP1, SP2, SP3, and SP4. The reference voltage bridge line RVBL may extend along the horizontal direction in an upper area of the plurality of subpixels from the reference voltage line RVL to supply a reference voltage to at least some subpixels among the plurality of subpixels.

In this case, the driving transistors DRT disposed in the four subpixel circuits SPC1, SPC2, SPC3, and SPC4 corresponding to the four subpixels SP1, SP2, SP3, and SP4 may commonly receive the reference voltage Vref through one reference voltage line RVL and the reference voltage bridge line RVBL.

In this case, the touch electrode TE may be positioned along an area in which the reference voltage line RVL extending in the vertical direction is disposed and an area in which the reference voltage bridge line RVBL extending in the horizontal direction is disposed. In other words, the touch electrode TE may be patterned to be positioned along a first line area in which the reference voltage line RVL is disposed with respect to the vertical direction, and to be positioned along an area in which the reference voltage bridge line RVBL is disposed with respect to the horizontal direction.

In this case, when the touch electrode pattern is formed in a plate type without an opening, it may be formed of a transparent electrode. Alternatively, when the touch electrode pattern is formed in a mesh type with an opening, it may be formed of a transparent electrode or an opaque electrode.

As described above, as the touch electrode TE is disposed to overlap the reference voltage line RVL and the reference voltage bridge line RVBL, the aperture ratio of the touch display device 100 of the disclosure may be increased.

The four subpixels SP1, SP2, SP3, and SP4 are electrically connected to the four data lines DL1, DL2, DL3, and DL4, respectively. In this case, in order to supply the data voltage Vdata to the four subpixels SP1, SP2, SP3, and SP4, the area in which the four data lines DL1, DL2, DL3, and DL4 are arranged in the vertical direction may be referred to as a second line area.

Further, in the touch display device 100 according to the disclosure, one or more driving voltage lines DVL for transferring the driving voltage EVDD may be disposed, and the driving voltage EVDD may be transferred to one or more subpixels SP. In this case, in order to supply the driving voltage EVDD to the four subpixels SP1, SP2, SP3, and SP4, the area in which the driving voltage line DVL is disposed in the vertical direction may be referred to as a third line area. Here, an example in which two subpixels SP are connected to one driving voltage line DVL is described.

Here, since the reference voltage Vref and the driving voltage EVDD correspond to constant voltages supplied at the predetermined level, the first line area in which the reference voltage line RVL is disposed and the third line area in which the driving voltage line DVL is disposed may be referred to as the constant voltage line area.

On the other hand, since the data voltage Vdata is a pulsed voltage whose level is changed according to the image, the second line area in which the data line DL is disposed may be referred to as a pulse voltage line area.

In the touch display device 100 of the disclosure, the colors of the subpixels SP constituting the pixel are not limited to white, red, green, and blue, and the color or position may vary depending on the type of the touch display device 100.

Figure 7:
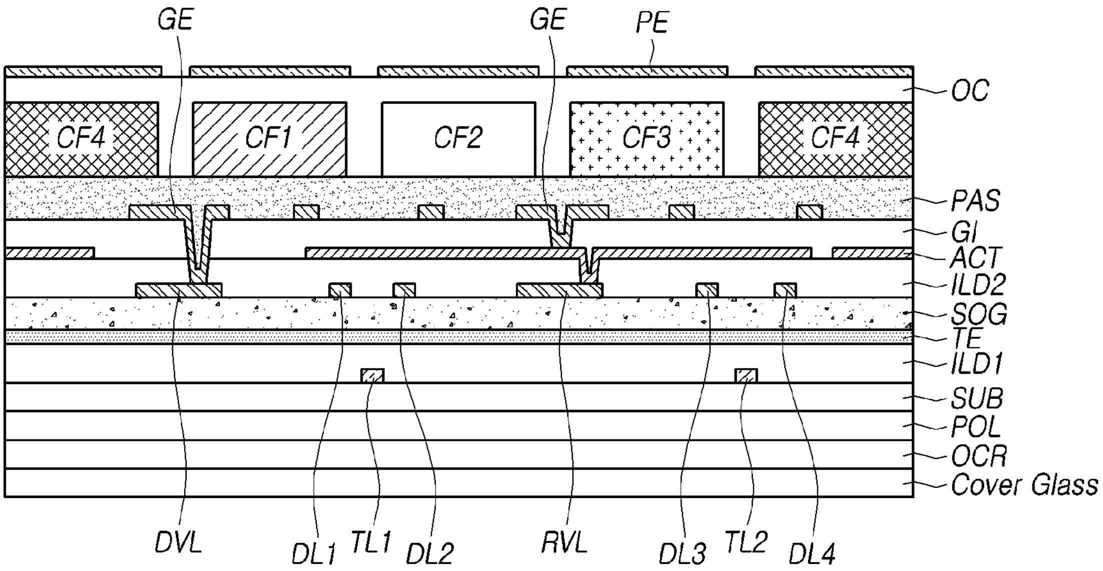
FIG. 7 is a cross-sectional view illustrating an example area in which a reference voltage bridge line overlaps a touch electrode in a touch display device according to embodiments of the disclosure.

FIG. 7 is a cross-sectional view illustrating an example area in which a reference voltage bridge line overlaps a touch electrode in a touch display device according to embodiments of the disclosure.

Specifically, FIG. 7 illustrates a cross section of an X1-Y1 area in which the touch electrode TE and the reference voltage bridge line RVBL overlap each other.

Referring to FIG. 7, the display panel 110 of the touch display device 100 according to embodiments of the disclosure may include a cover glass, a transparent adhesive layer OCR on the cover glass, a polarizing plate POL disposed on the transparent adhesive layer OCR, and a substrate SUB disposed on the polarizing plate POL.

Two touch sensor metals for forming the touch electrode TE and the touch line TL may be disposed on the substrate SUB. A first inter-layer insulation layer ILD1 may be positioned between the touch electrode TE and the touch line TL.

One or more insulation layers SOG may be positioned on the touch electrode TE. The insulation layer SOG positioned on the touch electrode TE may be formed through a spin-on-glass method. Here, the spin-on-glass method may be a process of forming an insulation film by rotationally applying glass dissolved with an organic solvent to the surface on which the insulation layer SOG is to be formed and heat-treating the surface.

Signal lines such as a driving voltage line DVL, a reference voltage line RVL, and data lines DL1 to DL4 may be formed on the insulation layer SOG formed by the spin-on glass method.

A second inter-layer insulation layer ILD2 may be positioned on the signal line, and a transistor TFT may be formed.

The transistor TFT may include several insulation layers, an active layer ACT, a gate node, a source node, and a drain node. The gate node, the source node, and the drain node may be formed using the same gate metal GE.

In this case, the active layer ACT may be formed on the second inter-layer insulation layer ILD2 to serve as a bridge line connecting the upper-positioned gate metal GE and the lower-positioned reference voltage line RVL. As described above, when the gate metal GE and the reference voltage line RVL are connected using the active layer ACT as a bridge line, it is not necessary to form a deep contact hole to connect the gate metal GE to the reference voltage line RVL, so that the manufacturing process is easy and the loss of the gate metal GE or the reference voltage line RVL may be reduced.

Further, the gate metal TE and the driving voltage line DVL may also connect the active layer ACT by the bridge line, but only a case where the gate metal GE and the reference voltage line RVL are connected by using the active layer ACT as the bridge line is illustrated here.

The gate insulation film GI may be positioned between the active layer ACT and the gate metal GE, and the protection layer PAS and the color filters CF1 to CF4 may be sequentially formed on the gate metal GE.

The overcoat layer OC may be positioned on the color filter CF1 to CF4, and the pixel electrode PE may be positioned on the overcoat layer OC.

When the display panel 110 has a bottom emission structure, the touch sensor metal configuring the plurality of touch electrodes TE and the plurality of touch lines TL may be disposed between the gate metal GE and the substrate SUB.

In this case, as the light shield LS disposed to block light between the subpixels SP, the aperture ratio may be decreased, and the touch sensitivity may be reduced by the capacitance formed between the reference voltage line RVL and the light shield LS and the capacitance formed between the light shield LS and the touch electrode TE.

In the touch display device 100 according to the disclosure, no light shield is formed on the touch electrode TE, so that the aperture ratio may be enhanced, and deterioration of touch sensitivity due to parasitic capacitance may be prevented. Further, by connecting the gate metal GE and the signal line (e.g., the reference voltage line RVL or the driving voltage line DVL) using the active layer ACT as the bridge line, the yield of the manufacturing process may be enhanced.

As such, as the touch electrode TE is formed to overlap the reference voltage line RVL, it is possible to effectively reduce parasitic capacitance by synchronizing the reference voltage Vref applied through the reference voltage line RVL with the touch driving signal applied to the touch electrode TE.

Figure 8:
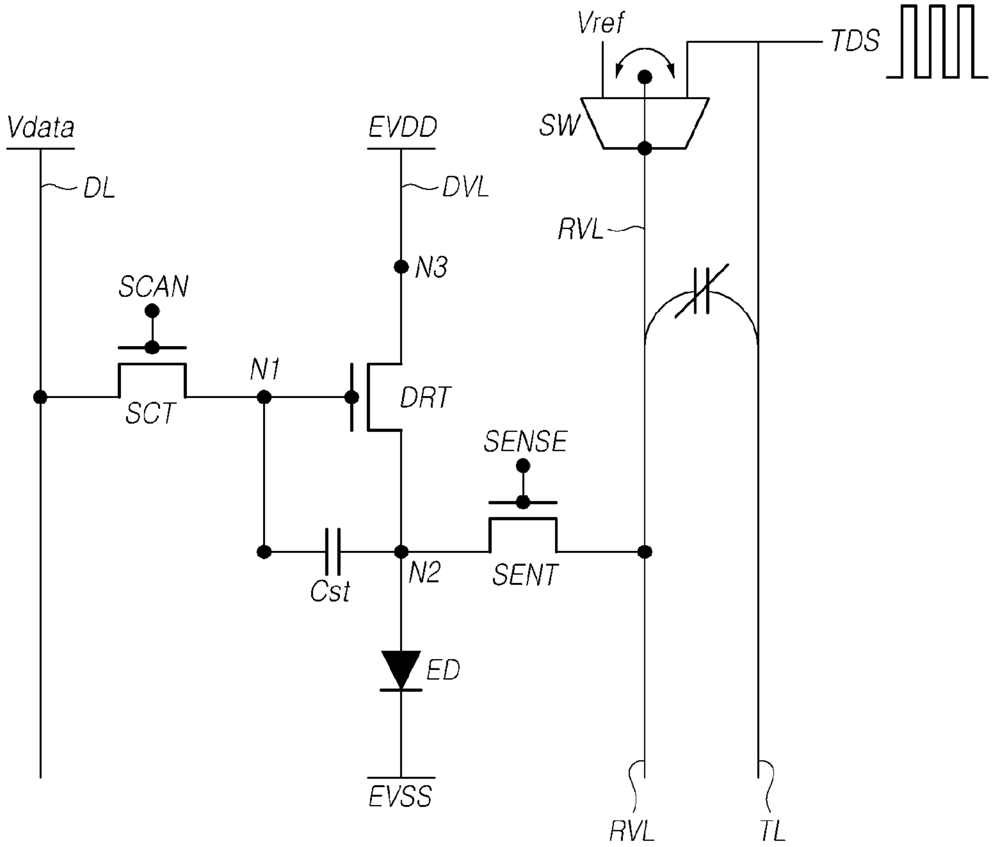
FIG. 8 is a view illustrating an example subpixel circuit synchronizing a touch driving signal to a reference voltage applied through a reference voltage line in a touch display device according to embodiments of the disclosure.

FIG. 8 is a view illustrating an example subpixel circuit synchronizing a touch driving signal to a reference voltage applied through reference voltage line in a touch display device according to embodiments of the disclosure.

Referring to FIG. 8, a subpixel SP circuit of a touch display device 100 according to embodiments of the disclosure may include a light emitting element ED, a driving transistor DRT driving the light emitting element ED by controlling a current flowing to the light emitting element ED, a scan transistor SCT transferring a data voltage Vdata to the gate node of the driving transistor DRT, a storage capacitor Cst for maintaining a voltage for a predetermined period, a sense transistor SENT for an initializing operation and a sensing operation, and a switch SW selectively transferring a reference voltage Vref or a touch driving signal TDS to a reference voltage line RVL.

A base voltage EVSS may be applied to the cathode electrode of the light emitting element ED. The base voltage EVSS may be a ground voltage or a voltage similar to the ground voltage, for example.

The driving transistor DRT is a transistor for driving the light emitting element ED, and includes a first node N1, a second node N2, and a third node N3.

The first node N1 of the driving transistor DRT is a node corresponding to the gate node and may be electrically connected with the source node or drain node of the scan transistor SCT. The second node N2 of the driving transistor DRT may be electrically connected with the anode electrode of the light emitting element ED and may be the source node or drain node. The third node N3 of the driving transistor DRT may be a node to which driving voltage EVDD is applied, be electrically connected with a driving voltage line DVL for supplying the driving voltage EVDD, and be the drain node or source node. Hereinafter, for convenience of description, in the example described below, the second node N2 of the driving transistor DRT may be a source node and the third node N3 may be a drain node.

In response to the scan signal SCAN supplied from a corresponding scan signal line among a plurality of scan signal lines which are a kind of the gate lines GL, the scan transistor SCT may control connection between the first node N1 of the driving transistor DRT and a corresponding data line DL among the plurality of data lines DL.

The drain node or source node of the scan transistor SCT may be electrically connected to a corresponding data line DL. The source node or drain node of the scan transistor SCT may be electrically connected to the first node N1 of the driving transistor DRT. The gate node of the scan transistor SCT may be electrically connected to the scan signal line, which is a kind of gate line GL, to receive the scan signal SCAN.

The scan transistor SCT may be turned on by the scan signal SCAN of a turn-on level voltage and transfer the data voltage Vdata supplied from the data line DL to the first node N1 of the driving transistor DRT.

The scan transistor SCT is turned on by the turn-on level scan signal SCAN and turned off by the turn-off level scan signal SCAN. When the scan transistor SCT is of the n type, the turn-on level may be a high-level voltage, and the turn-off level may be a low-level voltage. When the scan transistor SCT is of the p type, the turn-on level may be a low-level voltage, and the turn-off level may be a high-level voltage.

In response to the sense signal SENSE supplied from a corresponding sense signal line among a plurality of sense signal lines which are a kind of the gate lines GL, the sense transistor SENT may control connection between the second node N2 of the driving transistor DRT and a corresponding reference voltage line RVL among the plurality of reference voltage lines RVL.

The drain node or source node of the sense transistor SENT may be electrically connected to the reference voltage line RVL. The source node or drain node of the sense transistor SENT may be electrically connected to the second node N2 of the driving transistor DRT and may be electrically connected to the anode electrode of the light emitting element ED. The gate node of the sense transistor SENT may be electrically connected to the sense signal line, which is a kind of gate line GL, to receive the sense signal SENSE.

The sense transistor SENT may be turned on by the turn-on level sense signal SENSE and apply a reference voltage Vref supplied through the reference voltage line RVL to the second node N2 of the driving transistor DRT during the display driving period.

The sense transistor SENT is turned on by the turn-on level sense signal SENSE and turned off by the turn-off level sense signal SENSE. When the sense transistor SENT is of the n type, the turn-on level may be a high-level voltage, and the turn-off level may be a low-level voltage. When the sense transistor SENT is of the p type, the turn-on level may be a low-level voltage, and the turn-off level may be a high-level voltage.

The storage capacitor Cst may be electrically connected between the first node N1 and the second node N2 of the driving transistor DRT to maintain the data voltage Vdata corresponding to the image data during one frame time.

The storage capacitor Cst may be an external capacitor intentionally designed to be outside the driving transistor DRT, but not a parasite capacitor (e.g., Cgs or Cgd) which is an internal capacitor present between the first node N1 and the second node N2 of the driving transistor DRT. Each of the driving transistor DRT, the scan transistor SCT, and the sense transistor SENT may be an n-type transistor or a p-type transistor. All of the driving transistor DRT, the scan transistor SCT, and the sense transistor SENT may be n-type transistors or p-type transistors. At least one of the driving transistor DRT, the scan transistor SCT, and the sense transistor SENT may be an n-type transistor (or a p-type transistor), and the others may be p-type transistors (or n-type transistors).

The 3T1C structure of the subpixel SP exemplified herein is merely an example for description, and may further include one or more transistors or, in some cases, one or more storage capacitors. The plurality of subpixels SP may have the same structure, or some of the plurality of subpixels SP may have a different structure.

In this case, the reference voltage Vref supplied through the reference voltage line RVL during the display driving period may be a display driving reference voltage and may include a sensing reference voltage for sensing the characteristic value (threshold voltage or mobility) of the driving transistor DRT.

The touch display device 100 according to embodiments of the disclosure may apply the reference voltage Vref to the reference voltage line RVL during the display driving period through the switch SW connected to the reference voltage line RVL and transfer the touch driving signal TDS to the reference voltage line RVL during the touch driving period.

In other words, it is possible to reduce the parasitic capacitance formed between the touch electrode TE and the reference voltage line RVL by applying the same touch driving signal TDS to the reference voltage line RVL during the touch driving period when the touch driving signal TDS for driving the touch electrode TE is transferred through the touch line TL in a state in which the touch electrode TE is disposed to overlap the reference voltage line RVL.

Accordingly, the touch display device 100 according to the disclosure may prevent a reduction in touch sensitivity due to the parasitic capacitance formed between the touch electrode TE and the reference voltage line RVL even when no light shield is formed on the touch electrode TE.

Figure 9:
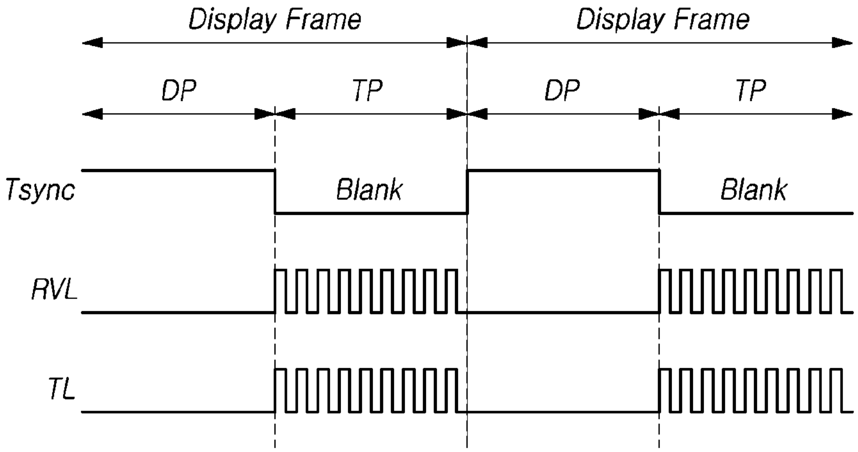
FIG. 9 is a view illustrating an example of a reference voltage and a touch signal applied in a display driving period and a touch driving period in a touch display device according to embodiments of the disclosure.

FIG. 9 is a view illustrating an example of a reference voltage and a touch signal applied in a display driving period and a touch driving period in a touch display device according to embodiments of the disclosure.

Referring to FIG. 9, the touch display device 100 according to embodiments of the disclosure may perform display driving for image display during a predetermined display driving period DP within one display frame period Display Frame and may perform touch driving for sensing a touch input by a finger or a stylus during a predetermined touch driving period TP.

In this case, the touch display device 100 may use the pixel electrode (the anode electrode of the light emitting element) for pixel driving or the common electrode (the cathode electrode of the light emitting element) as the touch electrode TE. Therefore, a direct current (DC) voltage may be supplied to the touch electrode TE during the display driving period DP, and a pulsed touch driving signal TDS may be supplied to the touch electrode TE during the touch driving period TP.

The display driving period DP and the touch driving period TP may be temporally identical or overlap each other or be temporally separated periods.

When the display driving period DP and the touch driving period TP are temporally separated may be referred to as time division driving.

When the display driving period DP and the touch driving period TP are temporally identical, display driving and touch driving may be performed simultaneously, and such driving scheme may be referred to as time free driving.

In the case of time division driving, the display driving period DP and the touch driving period TP may alternate.

As such, when the display driving period DP and the touch driving period TP are temporally separated while alternating, the touch driving period TP may correspond to a blank period when display driving is not performed.

The touch display device 100 may generate a touch synchronization signal Tsync swinging to a high level and a low level, thereby identifying or controlling the display driving period DP and the touch driving period TP. In other words, the touch synchronization signal Tsync may be a timing control signal defining the touch driving period TP.

For example, a high-level period (or a low-level period) of the touch synchronization signal Tsync may correspond to the display driving period DP, and the low-level period (or high-level period) of the touch synchronization signal Tsync may correspond to the touch driving period TP.

In this case, the touch driving circuit 150 may apply the touch driving signal TDS to the touch electrode TE during the touch driving period TP in which the touch synchronization signal Tsync is at the low level and may sense the presence or absence of a touch and the touch position of the passive stylus or the active stylus using the touch sensing signal received from the touch electrode TE.

In this case, since the touch display device 100 of the disclosure connects the reference voltage line RVL and the touch line TL during the touch driving period TP by the switch SW, the touch driving signal TDS is applied to the reference voltage line RVL as well as to the touch line TL.

In relation to the scheme of allocating the display driving period DP and the touch driving period TP within one display frame period Display Frame, one display frame period Display Frame may be divided into one display driving period DP and one touch driving period TP, and display driving may be performed during the display driving period DP and touch driving for sensing the touch input by the passive stylus or the active stylus may be performed during the touch driving period TP.

In other words, the touch display device 100 may perform driving for a touch once during the display frame period Display Frame which is one period of the frame frequency or the screen change period (refresh rate) of the display panel 110.

For example, when the frame frequency is 60 Hz, display driving of turning on or off the pixels through N gate lines constituting the display panel 110 within a period of 1/60s is performed, and then, the touch driving period TP for touch sensing proceeds for a predetermined interval. In this case, the touch detection frequency (touch report rate) will be 60 Hz.

As another example, one display frame period Display Frame may be divided into two or more display driving periods DP and two or more touch driving periods TP. Display driving may be performed during two or more display driving periods DP within one display frame period Display Frame, and touch driving for sensing one or two or more touch inputs by the passive stylus or the active stylus in the whole or part of the screen may be performed during two or more touch driving periods TP.

As such, when one display frame period Display Frame is divided into two or more display driving periods DP and two or more touch driving periods TP, and display driving and touch driving are performed, each of two or more blank periods Blank corresponding to two or more touch driving periods TP within one display frame period Display Frame may be referred to as a long horizontal blank (LHB).

Further, in the touch display device 100 of the disclosure, the touch electrode TE is disposed to overlap the driving voltage line DVL or the driving voltage bridge line or the data line DL, increasing the aperture ratio. In this case, as the touch line TL is disposed between data lines DL, the aperture ratio may further increase.

In this case, the parasitic capacitance may be reduced by connecting the driving voltage line DVL through the active layer ACT.

Figure 10:
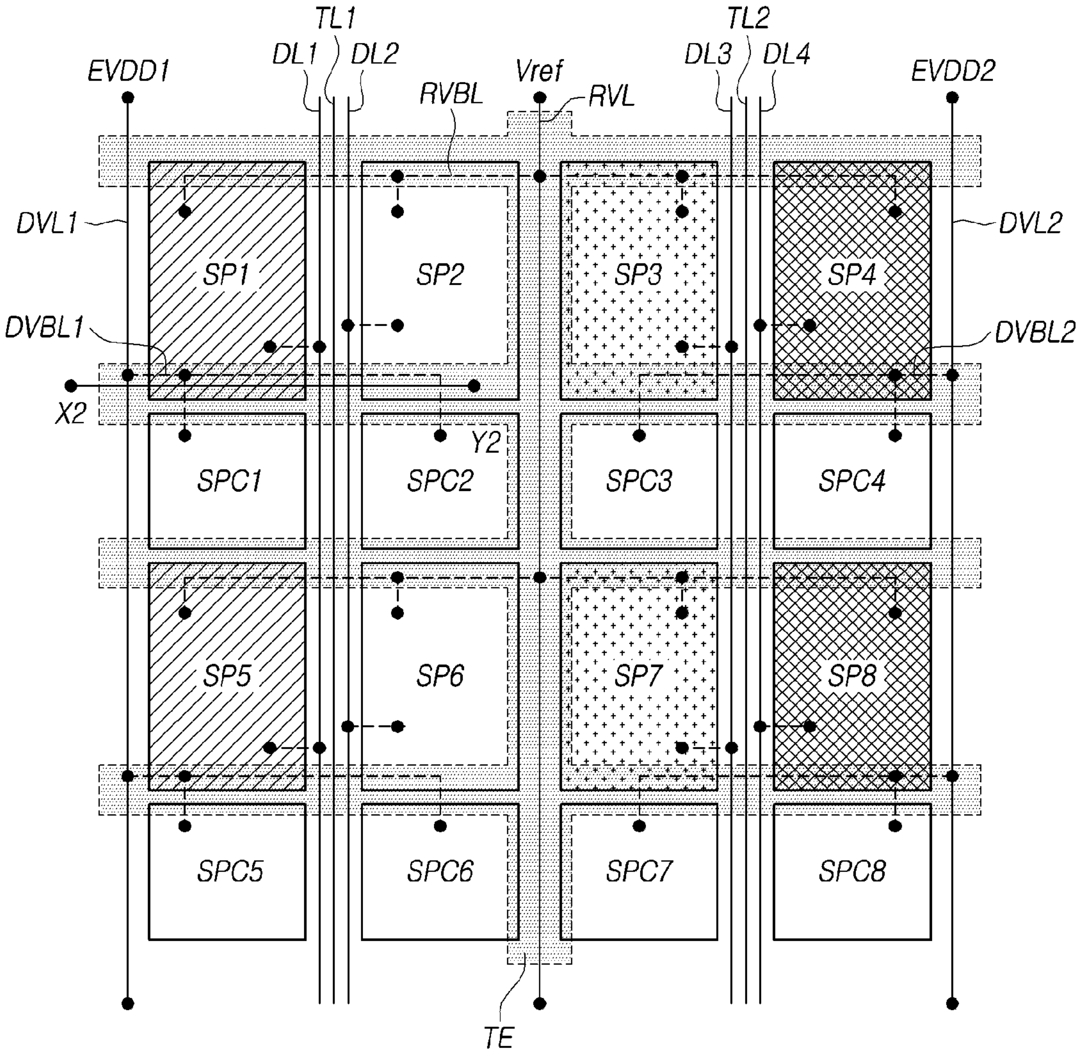
FIG. 10 is a plan view illustrating an example display panel in which a touch electrode is disposed to overlap a reference voltage line and a driving voltage line in a touch display device according to embodiments of the disclosure.

FIG. 10 is a plan view illustrating an example display panel in which a touch electrode is disposed to overlap a reference voltage line and a driving voltage bridge line in a touch display device according to embodiments of the disclosure.

Referring to FIG. 10, in the display panel 110 of the touch display device 100 according to embodiments of the disclosure, the reference voltage line RVL for transferring the reference voltage Vref may be disposed in an area between subpixels SP, and the touch electrode TE may be disposed to overlap the reference voltage line RVL.

The four subpixels SP1, SP2, SP3, and SP4 constituting one pixel may be four subpixels belonging to one subpixel (SP) row. For example, the four subpixels SP1, SP2, SP3, and SP4 may be a subpixel that emits red light, a subpixel that emits white light, a subpixel that emits green light, and a subpixel that emits blue light, respectively.

In this case, one reference voltage line RVL may be disposed every four sub-pixel (SP) columns for driving efficiency purposes, and an area in which the reference voltage line RVL extends in the vertical direction may be referred to as a first line area.

The reference voltage line RVL extending in the vertical direction may be commonly connected to the four subpixels SP1, SP2, SP3, and SP4 through the reference voltage bridge line RVBL branched in the horizontal direction. The reference voltage bridge line RVBL may extend through an upper area of four subpixels SP1, SP2, SP3, and SP4.

In this case, the driving transistors DRT disposed in the four subpixel circuits SPC1, SPC2, SPC3, and SPC4 corresponding to the four subpixels SP1, SP2, SP3, and SP4 may commonly receive the reference voltage Vref through one reference voltage line RVL and the reference voltage bridge line RVBL.

In this case, the touch electrode TE may be positioned along an area in which the reference voltage line RVL extending in the vertical direction is disposed and an area in which the reference voltage bridge line RVBL extending in the horizontal direction is disposed. In other words, the touch electrode TE may be patterned to be positioned along a first line area in which the reference voltage line RVL is disposed with respect to the vertical direction, and to be positioned along an area in which the reference voltage bridge line RVBL is disposed with respect to the horizontal direction.

In this case, when the touch electrode pattern is formed in a plate type without an opening, it may be formed of a transparent electrode. Alternatively, when the touch electrode pattern is formed in a mesh type with an opening, it may be formed of a transparent electrode or an opaque electrode.

As described above, as the touch electrode TE is disposed to overlap the reference voltage line RVL and the reference voltage bridge line RVBL, the aperture ratio of the touch display device 100 of the disclosure may be increased.

The four subpixels SP1, SP2, SP3, and SP4 are electrically connected to correspond to the four data lines DL1, DL2, DL3, and DL4, respectively. In this case, in order to supply the data voltage Vdata to the four subpixels SP1, SP2, SP3, and SP4, the area in which the four data lines DL1, DL2, DL3, and DL4 are arranged in the vertical direction may be referred to as a second line area.

Further, in the touch display device 100 according to the disclosure, one or more driving voltage lines DVL for transferring the driving voltage EVDD may be disposed, and the driving voltage EVDD may be transferred to one or more subpixels SP. In this case, in order to supply the driving voltage EVDD to the four subpixels SP1, SP2, SP3, and SP4, the area in which the driving voltage line DVL is disposed in the vertical direction may be referred to as a third line area. Here, an example in which two subpixels SP are connected to one driving voltage line DVL is described.

The first driving voltage line DVL1 extending in the vertical direction may be commonly connected with the two subpixels SP1 and SP2 through the first driving voltage bridge line DVBL1 branched in the horizontal direction, and the second driving voltage line DVL2 may be commonly connected with the two subpixels SP3 and SP4 through the second driving voltage bridge line DVBL2 branched in the horizontal direction. The first driving voltage bridge line DVBL1 and the second driving voltage bridge line DVBL2 may extend through a lower area of the four subpixels SP1, SP2, SP3, and SP4. The driving voltage bridge line may extend along the horizontal direction in the lower area of the plurality of subpixels from the driving voltage line to supply a driving voltage to at least some subpixels among the plurality of subpixels.

In this case, the driving transistor DRT disposed in the four subpixel circuits SPC1, SPC2, SPC3, and SPC4 corresponding to the four subpixels SP1, SP2, SP3, and SP4 may commonly receive the driving voltages EVDD1 and EVDD2 through the two driving voltage lines DVL1 and DVL2 and the two driving voltage bridge lines DVBL1 and DVBL2.

In this case, the touch electrode TE may be formed along the area in which the horizontal driving voltage bridge line DVBL is disposed. In other words, the touch electrode TE may be additionally formed along the area in which the driving voltage bridge lines DVBL1 and DVBL2 are disposed with respect to the horizontal direction.

In this case, when the touch electrode pattern is formed in a plate type without an opening, it may be formed of a transparent electrode. Alternatively, when the touch electrode pattern is formed in a mesh type with an opening, it may be formed of a transparent electrode or an opaque electrode.

As described above, as the touch electrode TE is disposed to overlap the reference voltage line RVL, the reference voltage bridge line RVBL, and the driving voltage bridge line DVBL, the aperture ratio of the touch display device 100 of the disclosure may be increased.

Meanwhile, the touch electrode TE may be additionally formed along a second line area in which the vertical driving voltage line DVL is disposed. In other words, the touch electrode TE may be disposed along the first line area in which the reference voltage line RVL is disposed, or may be disposed along the second line area in which the driving voltage line DVL is disposed.

In other words, as the touch electrode TE is disposed to overlap the driving voltage line DVL and the driving voltage bridge line DVBL, the aperture ratio of the touch display device 100 may be increased.

In the touch display device 100 of the disclosure, the colors of the subpixels SP constituting the pixel are not limited to white, red, green, and blue, and the color or position may vary depending on the type of the touch display device 100.

Figure 11:
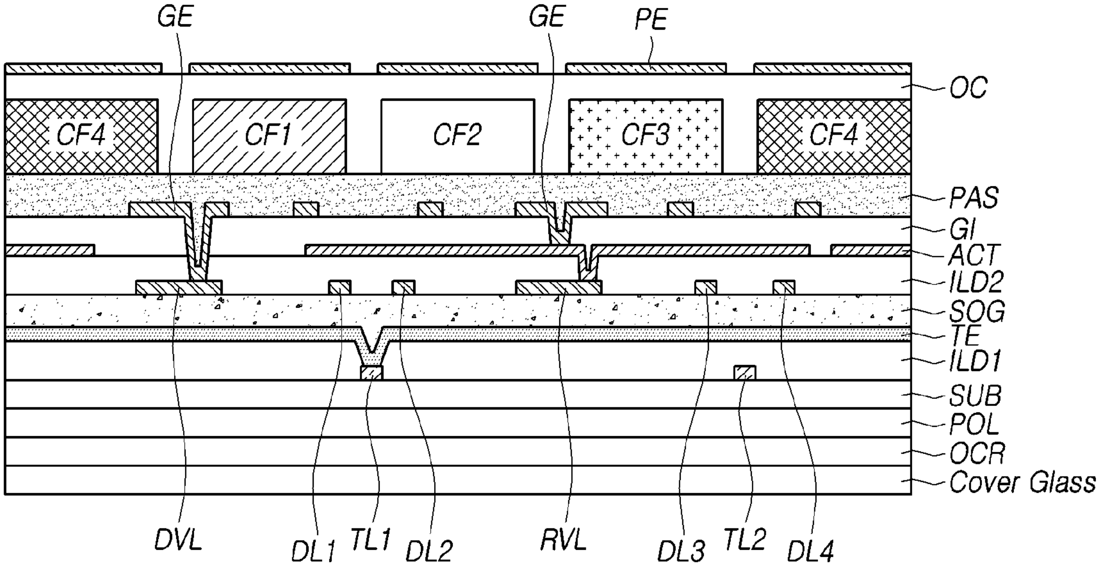
FIG. 11 is a cross-sectional view illustrating an example area in which a driving voltage bridge line overlaps a touch electrode in a touch display device according to embodiments of the disclosure.

FIG. 11 is a cross-sectional view illustrating an example area in which a driving voltage bridge line overlaps a touch electrode in a touch display device according to embodiments of the disclosure.

Specifically, FIG. 11 illustrates a cross section of an X2-Y2 area in which the touch electrode TE and the driving voltage bridge line DVBL overlap each other.

Referring to FIG. 11, the display panel 110 of the touch display device 100 according to embodiments of the disclosure may include a cover glass, a transparent adhesive layer OCR on the cover glass, a polarizing plate POL disposed on the transparent adhesive layer OCR, and a substrate SUB disposed on the polarizing plate POL.

Two touch sensor metals for forming the touch electrode TE and the touch line TL may be disposed on the substrate SUB. A first inter-layer insulation layer ILD1 may be positioned between the touch electrode TE and the touch line TL.

One or more insulation layers SOG may be positioned on the touch electrode TE. The insulation layer SOG positioned on the touch electrode TE may be formed through a spin-on-glass method. Here, the spin-on-glass method may be a process of forming an insulation film by rotationally applying glass dissolved with an organic solvent to the surface on which the insulation layer SOG is to be formed and heat-treating the surface.

Signal lines such as a driving voltage line DVL, a reference voltage line RVL, and data lines DL1 to DL4 may be formed on the insulation layer SOG formed by the spin-on glass method.

A second inter-layer insulation layer ILD2 may be positioned on the signal line, and a transistor TFT may be formed.

The transistor TFT may include several insulation layers, an active layer ACT, a gate node, a source node, and a drain node. The gate node, the source node, and the drain node may be formed using the same gate metal GE or different gate metals.

In this case, the active layer ACT may be formed on the second inter-layer insulation layer ILD2 to serve as a bridge line connecting the upper-positioned gate metal GE and the lower-positioned driving voltage line DVL. As described above, when the gate metal GE and the driving voltage line DVL are connected using the active layer ACT as a bridge line, it is not necessary to form a deep contact hole to connect the gate metal GE to the driving voltage line DVL, so that the manufacturing process is easy and the loss of the gate metal GE or the driving voltage line DVL may be reduced.

Further, the gate metal TE and the reference voltage line RVL may also connect the active layer ACT by the bridge line, but only a case where the gate metal GE and the driving voltage line DVL are connected by using the active layer ACT as the bridge line is illustrated here.

The gate insulation film GI may be positioned between the active layer ACT and the gate metal GE, and the protection layer PAS and the color filters CF1 to CF4 may be sequentially formed on the gate metal GE.

The overcoat layer OC may be positioned on the color filter CF1 to CF4, and the pixel electrode PE may be positioned on the overcoat layer OC.

When the display panel 110 has a bottom emission structure, the touch sensor metal capable of configuring the plurality of touch electrodes TE and the plurality of touch lines TL may be disposed between the gate metal GE and the substrate SUB.

In this case, as the light shield LS disposed to block light between the subpixels SP, the aperture ratio may be decreased, and the touch sensitivity may be reduced by the capacitance formed between the driving voltage line DVL and the light shield LS and the capacitance formed between the light shield LS and the touch electrode TE.

In the touch display device 100 according to the disclosure, no light shield is formed on the touch electrode TE, so that the aperture ratio may be enhanced, and deterioration of touch sensitivity due to parasitic capacitance may be prevented. Further, by connecting the gate metal GE and the driving voltage line DVL using the active layer ACT as the bridge line, the yield of the manufacturing process may be enhanced.

Further, the touch display device 100 according to the disclosure may configure the pixels PXL forming the display panel 110 with three subpixels SP1, SP2, and SP3. For example, the three subpixels SP1, SP2, and SP3 may be a subpixel that emits red light, a subpixel that emits green light, and a subpixel that emits blue light, respectively.

Figure 12:
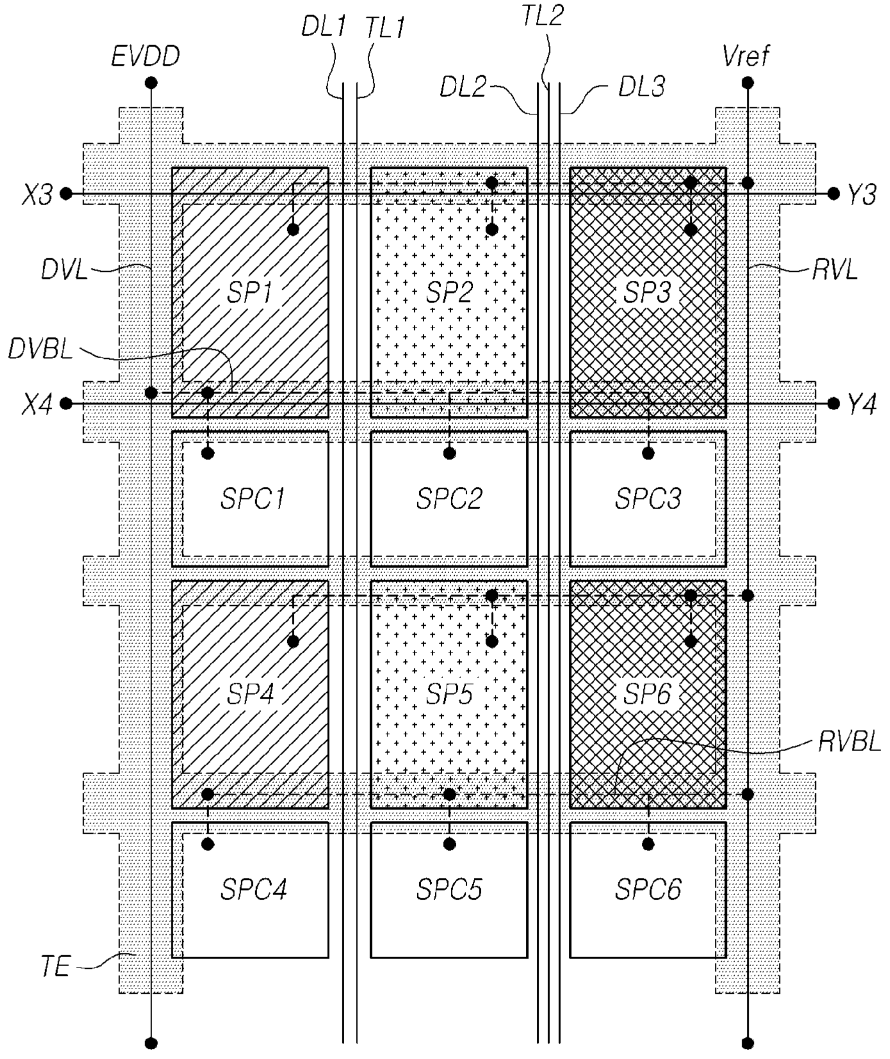
FIG. 12 is a plan view illustrating an example display panel in which a touch electrode is disposed to overlap a reference voltage line and a driving voltage bridge line when three subpixels constitute one pixel in a touch display device according to embodiments of the disclosure.

FIG. 12 is a plan view illustrating an example display panel in which a touch electrode is disposed to overlap a reference voltage line and a driving voltage bridge line when three subpixels constitute one pixel in a touch display device according to embodiments of the disclosure.

Referring to FIG. 12, in the display panel 110 of the touch display device 100 according to embodiments of the disclosure, a reference voltage line RVL for transmitting a reference voltage Vref and a driving voltage line DVL for transmitting a driving voltage EVDD may be alternately disposed in an area between the third subpixel SP3 and the first subpixel SP1.

In this case, the touch electrode TE may be disposed to overlap the reference voltage line RVL and the driving voltage line DVL.

The three subpixels SP1, SP2, and SP3 constituting one pixel PXL may be three subpixels belonging to one subpixel (SP) row. For example, the three subpixels SP1, SP2, and SP3 may be a subpixel that emits red light, a subpixel that emits green light, and a subpixel that emits blue light, respectively.

In this case, one reference voltage line RVL may be disposed every three sub-pixel (SP) columns for driving efficiency purposes, and an area in which the reference voltage line RVL extends in the vertical direction may be referred to as a first line area.

The reference voltage line RVL extending in the vertical direction may be commonly connected to the three subpixels SP1, SP2, and SP3 through the reference voltage bridge line RVBL branched in the horizontal direction. The reference voltage bridge line RVBL may extend through an upper area of three subpixels SP1, SP2, and SP3.

In this case, the driving transistors DRT disposed in the three subpixel circuits SPC1, SPC2, and SPC3 corresponding to the three subpixels SP1, SP2, and SP3 may commonly receive the reference voltage Vref through one reference voltage line RVL and the reference voltage bridge line RVBL. The driving transistors DRT disposed in the three subpixel circuits SPC4, SPC5, and SPC6 corresponding to the three subpixels SP4, SP5, and SP6 may commonly receive the reference voltage Vref through one reference voltage line RVL and the reference voltage bridge line RVBL.

In this case, the touch electrode TE may be positioned along an area in which the reference voltage line RVL extending in the vertical direction is disposed and an area in which the reference voltage bridge line RVBL extending in the horizontal direction is disposed. In other words, the touch electrode TE may be patterned to be positioned along a first line area in which the reference voltage line RVL is disposed with respect to the vertical direction, and to be positioned along an area in which the reference voltage bridge line RVBL is disposed with respect to the horizontal direction.

In this case, when the touch electrode pattern is formed in a plate type without an opening, it may be formed of a transparent electrode. Alternatively, when the touch electrode pattern is formed in a mesh type with an opening, it may be formed of a transparent electrode or an opaque electrode.

As described above, as the touch electrode TE is disposed to overlap the reference voltage line RVL and the reference voltage bridge line RVBL, the aperture ratio of the touch display device 100 of the disclosure may be increased.

The three subpixels SP1, SP2, and SP3 are electrically connected to correspond to the three data lines DL1, DL2, and DL3, respectively. In this case, in order to supply the data voltage Vdata to the three subpixels SP1, SP2, and SP3, the area in which the three data lines DL1, DL2, and DL3 are arranged in the vertical direction may be referred to as a second line area.

Further, in the touch display device 100 according to the disclosure, the driving voltage line DVL for transmitting the driving voltage EVDD may be disposed between the third subpixel SP3 and the first subpixel SP1 to transfer the driving voltage EVDD to the three subpixels SP1, SP2, and SP3. In this case, in order to supply the driving voltage EVDD to the three subpixels SP1, SP2, and SP3, the area in which the driving voltage line DVL is disposed in the vertical direction may be referred to as a third line area.

The driving voltage line DVL extending in the vertical direction may be commonly connected to the three subpixels SP1, SP2, and SP3 through the driving voltage bridge line DVBL branched in the horizontal direction. The driving voltage bridge line DVBL may extend through a lower area of three subpixels SP1, SP2, and SP3.

In this case, the driving transistors DRT disposed in the three subpixel circuits SPC1, SPC2, and SPC3 corresponding to the three subpixels SP1, SP2, and SP3 may commonly receive the driving voltage EVDD through the driving voltage line DVL and the driving voltage bridge line DVBL.

In this case, the touch electrode TE may be formed along the third line area in which the driving voltage line DVL is disposed and the area in which the horizontal driving voltage bridge line DVBL is disposed. In other words, the touch electrode TE may be additionally formed along the area in which the driving voltage bridge line DVBL is disposed with respect to the horizontal direction.

In this case, when the touch electrode TE is formed in a plate type without an opening, it may be formed of a transparent electrode. Alternatively, when the touch electrode TE is formed in a mesh type with an opening, it may be formed of a transparent electrode or an opaque electrode.

As described above, as the touch electrode TE is disposed to overlap the reference voltage line RVL, the reference voltage bridge line RVBL, and the driving voltage bridge line DVBL, the aperture ratio of the touch display device 100 of the disclosure may be increased.

Further, the touch electrode TE may be formed along a second line area in which the vertical driving voltage line DVL is disposed. In other words, the touch electrode TE may be disposed along the first line area in which the reference voltage line RVL is disposed, or may be disposed along the second line area in which the driving voltage line DVL is disposed.

As such, as the touch electrode TE is disposed to overlap the driving voltage line DVL and the driving voltage bridge line DVBL, the aperture ratio of the touch display device 100 may be increased.

Figure 13:
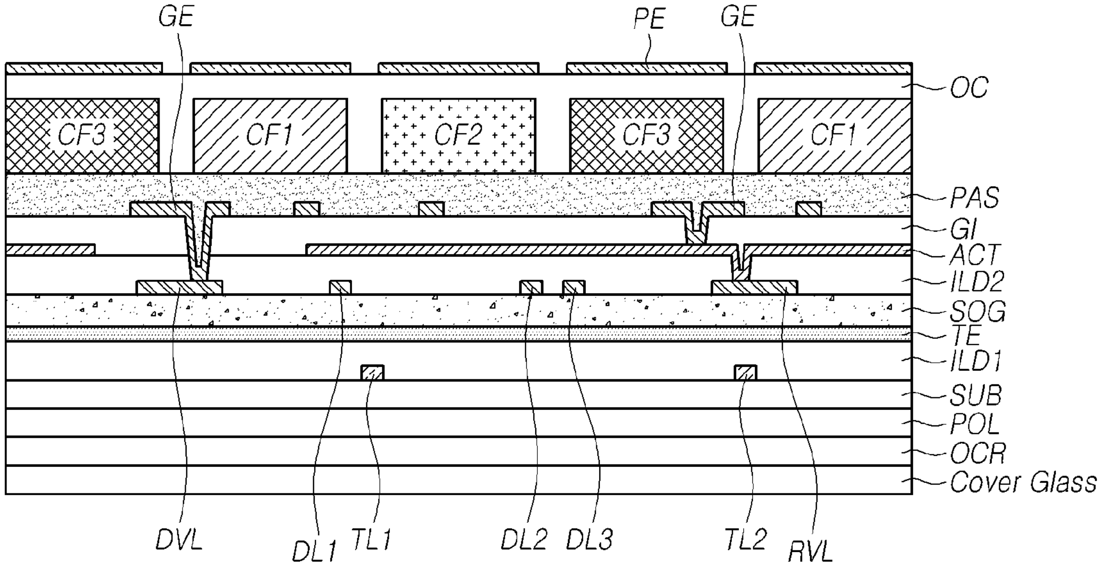
FIG. 13 is a cross-sectional view illustrating an example area in which a reference voltage bridge line overlaps a touch electrode when three subpixels constitute one pixel in a touch display device according to embodiments of the disclosure.

FIG. 13 is a cross-sectional view illustrating an example area in which a reference voltage bridge line overlaps a touch electrode when three subpixels constitute one pixel in a touch display device according to embodiments of the disclosure.

Specifically, FIG. 13 illustrates a cross section of an X3-Y3 area in which the touch electrode TE and the reference voltage bridge line RVBL overlap each other.

Referring to FIG. 13, the display panel 110 of the touch display device 100 according to embodiments of the disclosure may include a cover glass, a transparent adhesive layer OCR on the cover glass, a polarizing plate POL disposed on the transparent adhesive layer OCR, and a substrate SUB disposed on the polarizing plate POL.

Two touch sensor metals for forming the touch electrode TE and the touch line TL may be disposed on the substrate SUB. A first inter-layer insulation layer ILD1 may be positioned between the touch electrode TE and the touch line TL.

One or more insulation layers SOG may be positioned on the touch electrode TE. The insulation layer SOG positioned on the touch electrode TE may be formed through a spin-on-glass method. Here, the spin-on-glass method may be a process of forming an insulation film by rotationally applying glass dissolved with an organic solvent to the surface on which the insulation layer SOG is to be formed and heat-treating the surface.

Signal lines such as a driving voltage line DVL, a reference voltage line RVL, and data lines DL1 to DL3 may be formed on the insulation layer SOG formed by the spin-on glass method.

A second inter-layer insulation layer ILD2 may be positioned on the signal line, and a transistor TFT may be formed.

The transistor TFT may include several insulation layers, an active layer ACT, a gate node, a source node, and a drain node. The gate node, the source node, and the drain node may be formed using the same gate metal GE.

In this case, the active layer ACT may be formed on the second inter-layer insulation layer ILD2 to serve as a bridge line connecting the upper-positioned gate metal GE and the lower-positioned reference voltage line RVL. As described above, when the gate metal GE and the reference voltage line RVL are connected using the active layer ACT as a bridge line, it is not necessary to form a deep contact hole to connect the gate metal GE to the reference voltage line RVL, so that the manufacturing process is easy and the loss of the gate metal GE or the reference voltage line RVL may be reduced.

Further, the gate metal TE and the driving voltage line DVL may also connect the active layer ACT by the bridge line, but only a case where the gate metal GE and the reference voltage line RVL are connected by using the active layer ACT as the bridge line is illustrated here.

The gate insulation film GI may be positioned between the active layer ACT and the gate metal GE, and the protection layer PAS and the color filters CF1 to CF3 may be sequentially formed on the gate metal GE.

The overcoat layer OC may be positioned on the color filter CF1 to CF3, and the pixel electrode PE may be positioned on the overcoat layer OC.

When the display panel 110 has a bottom emission structure, the touch sensor metal capable of configuring the plurality of touch electrodes TE and the plurality of touch lines TL may be disposed between the gate metal GE and the substrate SUB.

In this case, as the light shield LS disposed to block light between the subpixels SP, the aperture ratio may be decreased, and the touch sensitivity may be reduced by the capacitance formed between the reference voltage line RVL and the light shield LS and the capacitance formed between the light shield LS and the touch electrode TE.

In the touch display device 100 according to the disclosure, no light shield is formed on the touch electrode TE, so that the aperture ratio may be enhanced, and deterioration of touch sensitivity due to parasitic capacitance may be prevented. Further, by connecting the gate metal GE and the reference voltage line RVL using the active layer ACT as the bridge line, the yield of the manufacturing process may be enhanced.

Further, as the touch electrode TE is formed to overlap the reference voltage line RVL, it is possible to effectively reduce parasitic capacitance by synchronizing the reference voltage Vref applied through the reference voltage line RVL with the touch driving signal applied to the touch electrode TE.

Figure 14:
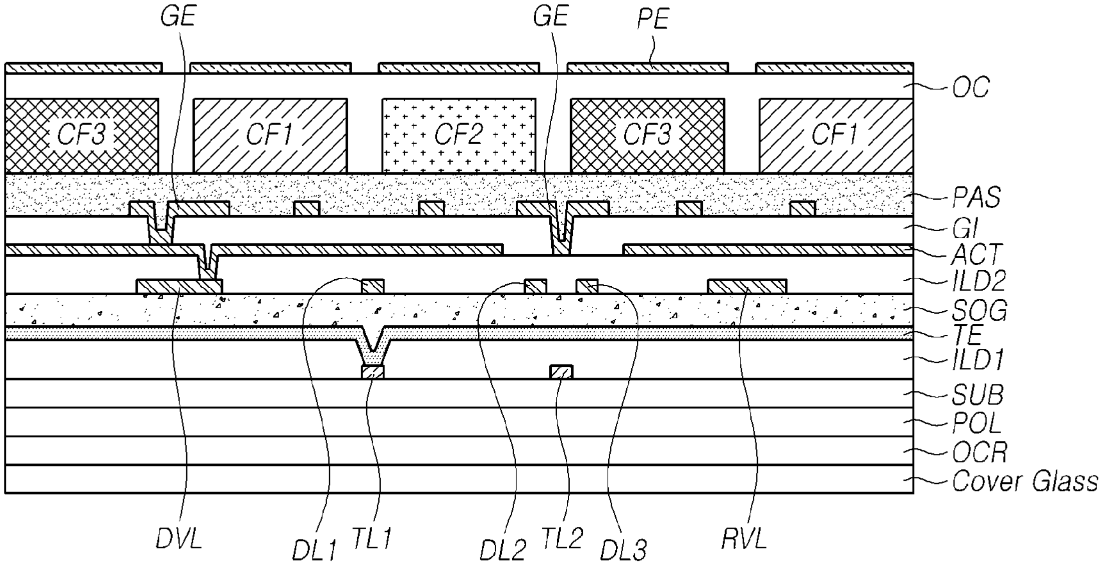
FIG. 14 is a cross-sectional view illustrating an example area in which a driving voltage bridge line overlaps a touch electrode when three subpixels constitute one pixel in a touch display device according to embodiments of the disclosure.

FIG. 14 is a cross-sectional view illustrating an example area in which a driving voltage bridge line overlaps a touch electrode when three subpixels constitute one pixel in a touch display device according to embodiments of the disclosure.

Specifically, FIG. 14 illustrates a cross section of an X4-Y4 area in which the touch electrode TE and the driving voltage bridge line DVBL overlap each other.

Referring to FIG. 14, the display panel 110 of the touch display device 100 according to embodiments of the disclosure may include a cover glass, a transparent adhesive layer OCR on the cover glass, a polarizing plate POL disposed on the transparent adhesive layer OCR, and a substrate SUB disposed on the polarizing plate POL.

Two touch sensor metals for forming the touch electrode TE and the touch line TL may be disposed on the substrate SUB. A first inter-layer insulation layer ILD1 may be positioned between the touch electrode TE and the touch line TL.

One or more insulation layers SOG may be positioned on the touch electrode TE. The insulation layer SOG positioned on the touch electrode TE may be formed through a spin-on-glass method. Here, the spin-on-glass method may be a process of forming an insulation film by rotationally applying glass dissolved with an organic solvent to the surface on which the insulation layer SOG is to be formed and heat-treating the surface.

Signal lines such as a driving voltage line DVL, a reference voltage line RVL, and data lines DL1 to DL3 may be formed on the insulation layer SOG formed by the spin-on glass method.

A second inter-layer insulation layer ILD2 may be positioned on the signal line, and a transistor TFT may be formed.

The transistor TFT may include several insulation layers, an active layer ACT, a gate node, a source node, and a drain node. The gate node, the source node, and the drain node may be formed using the same gate metal GE or different metals.

In this case, the active layer ACT may be formed on the second inter-layer insulation layer ILD2 to serve as a bridge line connecting the upper-positioned gate metal GE and the lower-positioned driving voltage line DVL. As described above, when the gate metal GE and the driving voltage line DVL are connected using the active layer ACT as a bridge line, it is not necessary to form a deep contact hole to connect the gate metal GE to the driving voltage line DVL, so that the manufacturing process is easy and the loss of the gate metal GE or the driving voltage line DVL may be reduced.

Further, the gate metal TE and the reference voltage line RVL may also connect the active layer ACT by the bridge line, but only a case where the gate metal GE and the driving voltage line DVL are connected by using the active layer ACT as the bridge line is illustrated here.

The gate insulation film GI may be positioned between the active layer ACT and the gate metal GE, and the protection layer PAS and the color filters CF1 to CF3 may be sequentially formed on the gate metal GE.

The overcoat layer OC may be positioned on the color filter CF1 to CF3, and the pixel electrode PE may be positioned on the overcoat layer OC.

When the display panel 110 has a bottom emission structure, the touch sensor metal capable of configuring the plurality of touch electrodes TE and the plurality of touch lines TL may be disposed between the gate metal GE and the substrate SUB.

In this case, as the light shield LS disposed to block light between the subpixels SP, the aperture ratio may be decreased, and the touch sensitivity may be reduced by the capacitance formed between the driving voltage line DVL and the light shield LS and the capacitance formed between the light shield LS and the touch electrode TE.

In the touch display device 100 according to the disclosure, no light shield is formed on the touch electrode TE, so that the aperture ratio may be enhanced, and deterioration of touch sensitivity due to parasitic capacitance may be prevented. Further, by connecting the gate metal GE and the driving voltage line DVL using the active layer ACT as the bridge line, the yield of the manufacturing process may be enhanced.

Embodiments of the disclosure described above are briefly described below.

A touch display device 100 according to embodiments of the disclosure may comprise a display area DA in which a plurality of subpixels SP are arranged in a first direction and a second direction, a reference voltage line RVL extending along the first direction in a first line area between the plurality of subpixels SP, a data line DL extending along the first direction in a second line area between the plurality of subpixels SP, a driving voltage line DVL extending along the first direction in a third line area between the plurality of subpixels SP, a touch electrode pattern disposed to overlap the reference voltage line RVL or the driving voltage line DVL, and a touch driving circuit 150 applying a touch driving signal TDS to the touch electrode pattern through a touch line TL and detecting touch according to a change in capacitance.

The touch electrode pattern may be formed of an opaque electrode in a mesh type in which an opening corresponds to the plurality of subpixels SP.

The touch line TL may be disposed to overlap the data line DL in the second line area.

The touch display device 100 may further comprise a reference voltage bridge line RVBL extending along the second direction in an upper area of the plurality of subpixels SP from the reference voltage line RVL to supply a reference voltage Vref to at least some subpixels SP among the plurality of subpixels SP.

The touch electrode pattern may be disposed to overlap the reference voltage line RVL and the reference voltage bridge line RVBL.

The touch display device 100 may further comprise a switch SW connected to the reference voltage line RVL. The switch SW may be controlled to apply the reference voltage Vref to the reference voltage line RVL during a display driving period DP and apply a touch driving signal TDS to the reference voltage line RVL during a touch driving period TP.

The reference voltage line RVL may be electrically connected to a transistor positioned in the plurality of subpixels SP via an active layer ACT formed on the reference voltage line RVL.

The touch display device 100 may further comprise a driving voltage bridge line DVBL extending along the second direction in a lower area of the plurality of subpixels SP from the driving voltage line DVL to supply a driving voltage EVDD to at least some subpixels SP among the plurality of subpixels SP.

The touch electrode pattern may be disposed to overlap the driving voltage line DVL and the driving voltage bridge line DVBL.

The driving voltage line DVL may be electrically connected to a transistor positioned in the plurality of subpixels SP via an active layer ACT formed on the driving voltage line DVL.

A display panel 110 according to embodiments of the disclosure may comprise a display area DA in which a plurality of subpixels SP are arranged in a first direction and a second direction, a reference voltage line RVL extending along the first direction in a first line area between the plurality of subpixels SP, a data line DL extending along the first direction in a second line area between the plurality of subpixels SP, a driving voltage line DVL extending along the first direction in a third line area between the plurality of subpixels SP, and a touch electrode pattern disposed to overlap the reference voltage line RVL or the driving voltage line DVL.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

What is claimed is:

1. A touch display device, comprising:

a display area in which a plurality of pixels including a first subpixel, a second subpixel, a third subpixel and a fourth subpixel are arranged in a first direction and a second direction;

a reference voltage line extending along the first direction in a first line area between the second subpixel and the third subpixel in each of the plurality of pixels;

a plurality of data lines extending along the first direction in a second line area between the first subpixel and the second subpixel, and between the third subpixel and the fourth subpixel in each of the plurality of pixels;

a driving voltage line extending along the first direction in a third line area outside each of the plurality of pixels;

a touch electrode pattern including a plurality of openings and a plurality of touch electrodes that surround the plurality of openings, at least some touch electrodes of the plurality of touch electrodes extending along the first direction overlap the reference voltage line in a plan view in the first line area without overlapping the plurality of data lines in the plan view in the second line area; and a touch driving circuit configured to apply a touch driving signal to the touch electrode pattern through a plurality of touch lines and detect a touch according to a change in capacitance of the touch electrode pattern.

2. The touch display device of claim 1, wherein each of the plurality of openings corresponds to a respective subpixel of a plurality of subpixels.

3. The touch display device of claim 1, wherein the plurality of touch lines overlaps the plurality of data lines in the plan view in the second line area.

4. The touch display device of claim 1, further comprising:

a reference voltage bridge line extending along the second direction outside each of the plurality of pixels from the reference voltage line, the reference voltage bridge line supplying a reference voltage to at least some subpixels among a plurality of subpixels.

5. The touch display device of claim 4, wherein at least some touch electrodes of the plurality of touch electrodes extending along the second direction overlap the reference voltage bridge line in the plan view.

6. The touch display device of claim 5, further comprising:

a switch connected to the reference voltage line, the switch is configured to apply the reference voltage to the reference voltage line during a display driving period and apply a touch driving signal to the reference voltage line during a touch driving period.

7. The touch display device of claim 1, wherein the reference voltage line is electrically connected to a transistor positioned in the plurality of pixels via an active layer that is on the reference voltage line.

8. The touch display device of claim 1, wherein each of the plurality of pixels includes a first subpixel circuit configured to control the first subpixel, a second subpixel circuit configured to control the second subpixel, a third subpixel circuit configured to control the third subpixel and a fourth subpixel circuit configured to control the fourth subpixel, the touch display device further comprising:

a driving voltage bridge line extending along the second direction between the first subpixel and the first subpixel circuit, between the second subpixel and the second subpixel circuit, between the third subpixel and the third subpixel circuit, and between the fourth subpixel and the fourth subpixel circuit from the driving voltage line, the driving voltage bridge line configured to supply a driving voltage to at least some subpixels among a plurality of subpixels.

9. The touch display device of claim 8, wherein at least some touch electrodes of the plurality of touch electrodes extending along the second direction overlap the driving voltage bridge line in the plan view.

10. The touch display device of claim 1, wherein the driving voltage line is electrically connected to a transistor positioned in a plurality of subpixels via an active layer that is on the driving voltage line.

11. The touch display device of claim 1, wherein a touch line of the plurality of touch lines is between a first data line of the plurality of data lines and a second data line of the plurality of data lines in the second line area.

12. The touch display device of claim 1, wherein the first line area and the third line area are both a constant voltage line area, and the second line area is a pulse voltage line area.

13. The touch display device of claim 7, wherein the transistor includes a gate node, a source node, and a drain node comprising as same gate metal, and the active layer is a bridge line that connects an upper-positioned gate metal and a lower-positioned reference voltage line.

14. The touch display device of claim 10, wherein the transistor includes a gate node, a source node, and a drain node including a same gate metal or a different gate metal, and the active layer is a bridge line that connects an upper-positioned gate metal and a lower-positioned driving voltage line.

15. The touch display device of claim 4, wherein the touch electrode pattern is positioned along the first line area in which the reference voltage line is disposed and along an area in which the reference voltage bridge line is disposed.

16. The touch display device of claim 8, wherein the touch electrode pattern is positioned along the third line area in which the driving voltage line is disposed and along an area in which the driving voltage bridge line is disposed.

17. A display panel, comprising:

a display area in which a plurality of pixels including a first subpixel, a second subpixel, a third subpixel and a fourth subpixel are arranged in a first direction and a second direction;

a reference voltage line extending along the first direction in a first line area between the second subpixel and the third subpixel in each of the plurality of pixels;

a plurality of data lines extending along the first direction in a second line area between the first subpixel and the second subpixel, and between the third subpixel and the fourth subpixel in each of the plurality of pixels;

a driving voltage line extending along the first direction in a third line area outside each of the plurality of pixels; and a touch electrode pattern including a plurality of openings and a plurality of touch electrodes that surround the plurality of openings, at least some touch electrodes of the plurality of touch electrodes extending along the first direction overlap the reference voltage line in a plan view in the first line area without overlapping the plurality of data lines in the plan view in the second line area.

* * * * *